(12) United States Patent
Chen et al.

(10) Patent No.: US 12,406,876 B2
(45) Date of Patent: Sep. 2, 2025

(54) SEMICONDUCTOR STRUCTURE INCLUDING ISOLATION STRUCTURE WITH DIELECTRIC STACK AND METHOD OF FORMING THE SAME

(71) Applicant: TAIWAN SEMICONDUCTOR MANUFACTURING COMPANY LTD., Hsinchu (TW)

(72) Inventors: Kui-Yu Chen, Miaoli (TW); Chi-Ruei Yeh, New Taipei (TW); Tsung-Yu Chiang, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 728 days.

(21) Appl. No.: 17/587,299

(22) Filed: Jan. 28, 2022

(65) Prior Publication Data
US 2023/0245921 A1 Aug. 3, 2023

(51) Int. Cl.
*H01L 21/762* (2006.01)
*H10D 84/01* (2025.01)
(Continued)

(52) U.S. Cl.
CPC ... *H01L 21/76224* (2013.01); *H10D 84/0151* (2025.01); *H10D 84/038* (2025.01); *H10D 84/834* (2025.01); *H10D 84/0149* (2025.01)

(58) Field of Classification Search
CPC .. H10D 30/024; H10D 30/0243; H10D 30/62; H10D 30/6211; H10D 30/6212; H10D 30/6213; H10D 30/6215; H10D 30/6217; H10D 30/6218; H10D 30/6219; H10D 62/115; H10D 62/116; H10D 64/017; H10D 84/0151; H10D 84/0153; H10D 84/0158; H10D 84/834; H10D 84/853; H10D 84/0193; H10D 84/0188; H01L 21/76213; H01L 21/76216; H01L 21/76218; H01L 21/76221; H01L 21/76224; H01L 21/76227; H01L 21/76229; H01L 21/76232; H01L 21/76235; H01L 21/76237; H01L 21/7624; H01L 21/76234; H01L 21/76245; H01L 21/76251; H01L 21/76248; H01L 21/76254; H01L 21/76256; H01L 21/76259; H01L 21/76262;
(Continued)

(56) References Cited

U.S. PATENT DOCUMENTS 4,631,803 A * 12/1986 Hunter ............ H01L 21/76202
257/520
2017/0179242 A1* 6/2017 Chang ............... H10D 64/679
(Continued)

*Primary Examiner* — Eric A. Ward
(74) *Attorney, Agent, or Firm* — WPAT LAW; Anthony King

(57) ABSTRACT

The present disclosure provides a method of manufacturing a semiconductor structure. The method includes providing a substrate; forming a fin structure on the substrate; forming a first dummy gate on the fin structure; forming a trench to penetrate the first dummy gate and the fin structure; forming a dielectric stack in the trench; removing a top portion of the dielectric stack in the trench to leave a lower portion of the dielectric stack in the trench; and forming a protective layer in the trench and directly on the lower portion of the dielectric stack.

20 Claims, 40 Drawing Sheets

(51) Int. Cl.
*H10D 84/03* (2025.01)
*H10D 84/83* (2025.01)

(58) Field of Classification Search
CPC ........... H01L 21/76264; H01L 21/7627; H01L 21/76291; H01L 21/76289; H01L 21/76286; H01L 21/76283; H01L 21/76281; H01L 21/76278; H01L 21/76275; H01L 21/76272; H01L 21/76297; H01L 21/76294; H01L 21/765; H01L 21/764; H01L 21/763; H01L 21/762; H01L 21/76202; H01L 21/76205; H01L 21/76208; H01L 21/7621
See application file for complete search history.

(56) References Cited

U.S. PATENT DOCUMENTS

| | | | |
|---|---|---|---|
| 2018/0138174 A1* | 5/2018 | Min | H01L 29/7848 |
| 2018/0358450 A1* | 12/2018 | Kim | H10D 30/62 |
| 2018/0366329 A1* | 12/2018 | Kim | H10D 64/017 |
| 2020/0203231 A1* | 6/2020 | Hsu | H10D 62/115 |
| 2020/0227323 A1* | 7/2020 | Zang | H10D 84/0158 |
| 2020/0402838 A1* | 12/2020 | Gu | H10D 84/0151 |

* cited by examiner

SEMICONDUCTOR STRUCTURE INCLUDING ISOLATION STRUCTURE WITH DIELECTRIC STACK AND METHOD OF FORMING THE SAME

BACKGROUND

Semiconductor structures are used in a variety of electronic applications, such as personal computers, cellular telephones, digital cameras, and other electronic equipment. Semiconductor structures are typically fabricated by sequentially depositing insulating or dielectric layers, conductive layers, and semiconductive layers of material over a semiconductive substrate, and patterning the various material layers using lithography to form circuit components and elements thereon.

The semiconductor industry continues to increase the integration density of various electronic components (e.g., transistors, diodes, resistors, capacitors, etc.) by achieving continual reductions in minimum feature size, which allow more components to be integrated into a given area.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION OF THE DISCLOSURE

Figure 1:
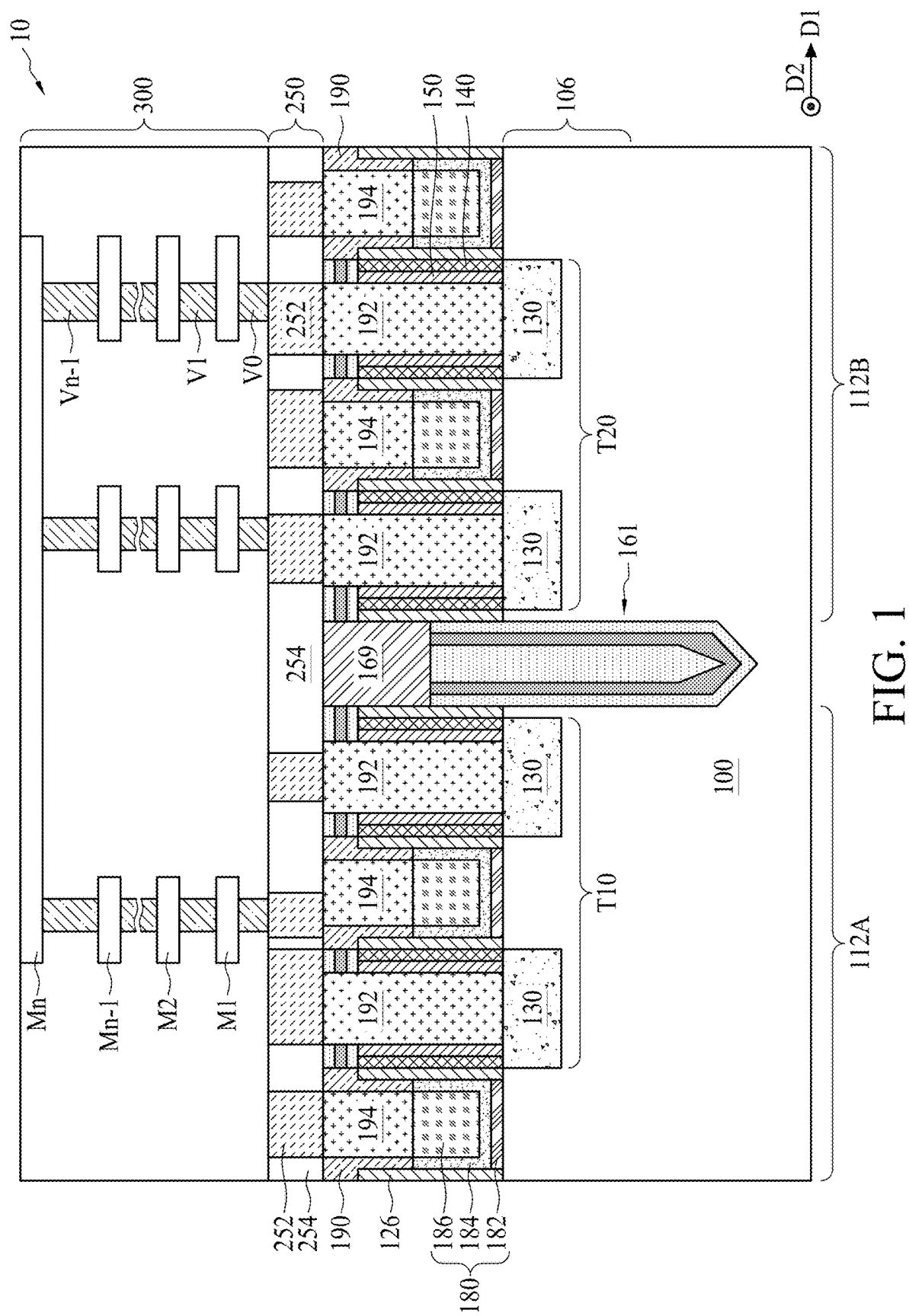
FIG. 1 is a schematic cross-sectional view of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally mean within a value or range which can be contemplated by people having ordinary skill in the art. Alternatively, the terms "substantially," "approximately," or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A metal-oxide-semiconductor field-effect-transistor (MOSFET) device is a device including a source terminal and a drain terminal separated by a region, referred to as a channel region of the MOSFET device. The MOSFET device is modulated by applying a voltage to an electrode (gate) which overlies the channel region and is separated from it by a thin insulating layer (generally referred to as a gate dielectric). The simple nature of the MOSFET devices and their minimal heat dissipation permit an extraordinary degree of miniaturization and consequently a high density of circuits.

A "continuous poly on oxide definition edge" or a "continuous poly on oxide diffusion edge" (CPODE) structure refers to an isolation structure that separates multiple active regions (i.e., oxide definition regions) by transforming a dummy structure that crosses the active regions into the isolation structure. The CPODE structure may be arranged proximal to a boundary between two active regions for achieving a desired electrical isolation performance. In the present disclosure, a CPODE structure is formed in the front-end-of-line (FEOL) stage of fabricating a semiconductor structure. The FEOL stage refers to processes of forming transistors and elements proximal to the transistors. The middle-end-of-line (MEOL) stage refers to processes of forming conductive contacts or vias electrically interconnecting the underlying transistors and overlying interconnection wires formed in the metallization layers, and the back-end-of-line (BEOL) stage refers to processes of forming interconnection or metallization layers over the transistors for routing the features in the transistors. The processes in the FEOL and MEOL stages provide a smaller critical dimension (CD) between elements, as compared to the processes in the BEOL stage.

FIG. 1 is a schematic cross-sectional view of a semiconductor structure 10, in accordance with some embodiments of the present disclosure. The semiconductor structure 10 includes a substrate 100 and a fin structure 106 on the substrate 100. A CPODE structure 161 including a dielectric stack penetrates the fin structure 106 and extends into the substrate 100. The dielectric stack includes an oxide-nitride-oxide ("ONO") structure. A top surface of the CPODE structure 161 is higher than a top surface of the fin structure 106 by about 30 Å to about 60 Å. The CPODE structure 161 separates to the fin structure 106 into a first active region 112A and a second active region 112B.

A first transistor T10 and a second transistor T20 adjacent to the first transistor T10 are disposed on the fin structure 106. Each of the first transistor T10 and the second transistor T20 includes a gate structure 180 and a pair of epitaxial features 130 on opposite sides of the gate structure 180. The gate structure 180 functions as a gate terminal of the transistor T10 or T20, and the pair of epitaxial features 130 adjacent to the gate structure 180 functions as source/drain terminals of the transistor T10 or T20.

A gate spacer 126 is disposed on a sidewall of the gate structure 180. The gate structure 180 includes a gate dielectric layer 182, a high-k material layer 184 and a gate electrode 186. In some embodiments, a height of the gate structure 180 is substantially lower than a height of the gate spacer 126. The gate dielectric layer 182 is a planar film disposed on the fin structure 106. The high-k material layer 184 may be a planar or U-shaped layer disposed on the gate dielectric layer 182. The gate electrode 186 may be a planar or U-shaped layer surrounded by the high-k material layer 184. In some embodiments, the gate spacer 126 surrounds the gate dielectric layer 182, the high-k material layer 184 and the gate electrode 186. In some embodiments, a top surface of the gate electrode 186 is lower than a top surface of the gate spacer 126. A hard mask 190 is formed over the gate structure 180. A protective layer 169 is directly disposed on the dielectric stack of the CPODE structure 161. The first transistor T10 and the second transistor T20 are separated by the CPODE structure 161 and the protective layer 169. The top surface of the CPODE structure 161 is lower than a top surface of the gate structure 180 or the gate spacer 126. In some embodiments, top surfaces of the hard mask 190 and the protective layer 169 are substantially coplanar.

A conductive via 192 is disposed on and electrically coupled to the underlying epitaxial feature 130. A conductive via 194 is disposed on and electrically coupled to the underlying gate electrode 186. An interconnect layer 250 is disposed over the conductive vias 192 and 194. The interconnect layer 250 includes a metal line layer 252 embedded in an interlayer dielectric (ILD) layer 254. The metal line layer 252 is disposed over and electrically coupled to the conductive vias 192 and 194. The metal line layer 252 may be electrically coupled to the transistor T10 or the transistor T20 through the conductive vias 192 and 194, respectively.

A metallization layer 300 is disposed over the interconnect layer 250. The metallization layer 300 includes a stack of metal line layers (wires) $M_1, \ldots M_{n-1}, M_n$ (the integer n denotes the layer index) disposed over one another and a stack of metal via layers $V_0, \ldots V_{n-1}$ (the integer n denotes the layer index) disposed over one another. A metal via layer $V_n$ is interposed between an underlying metal line layer $M_n$ and an overlying metal line layer $M_{n+1}$ and electrically connects the metal line layer $M_n$ and $M_{n+1}$. The number of n may be configured according to the design requirements of the metallization layer 300.

Figure 2:
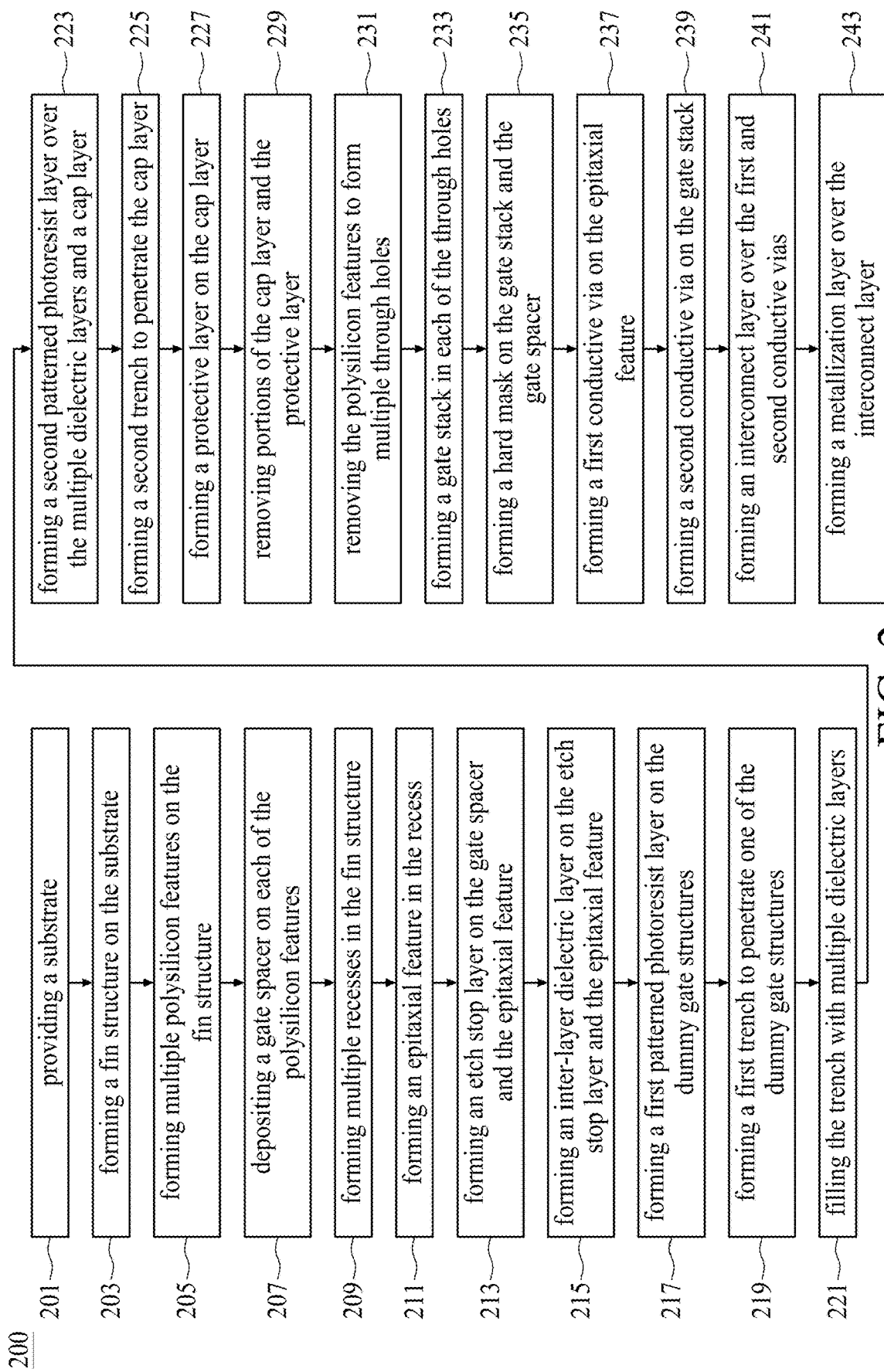
FIG. 2 is a flow diagram showing a method of fabricating a semiconductor structure, in accordance with some embodiments of the present disclosure.
Figure 3:
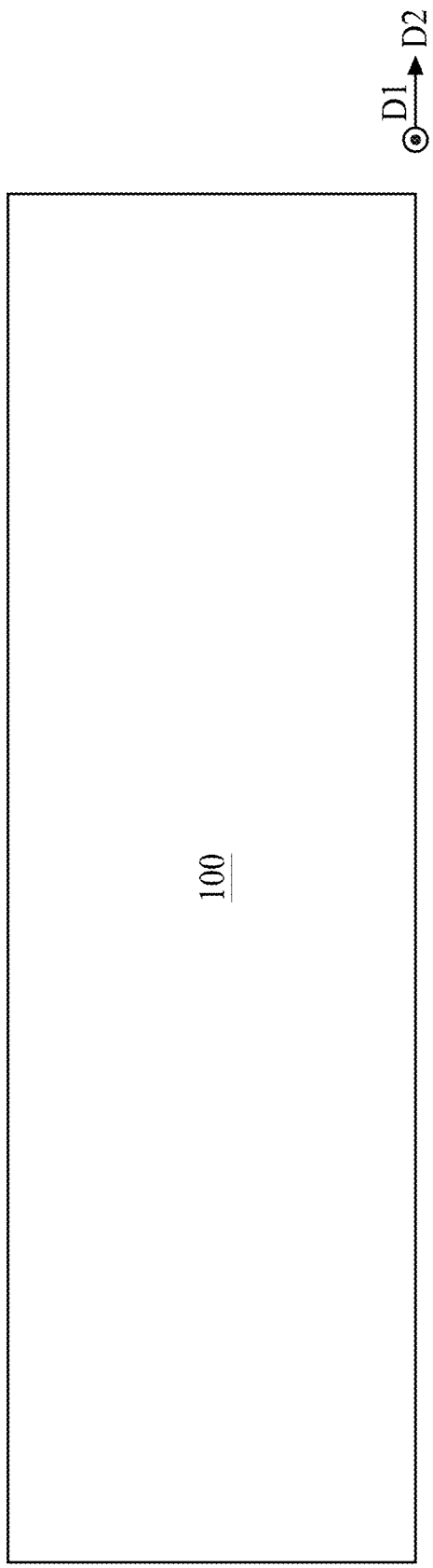
FIGS. 3, 4A to 4D, 5A, 6 to 10, 11A, 11B, 12A, 13A to 13D, 14A, 14B, 15A, 16, 17A, 18A, 18B, and 19 to 26 are schematic cross-sectional views and plan views illustrating sequential operations of the method shown in FIG. 2, in accordance with some embodiments of the present disclosure.

FIG. 2 is a flow diagram showing a method 200 of fabricating a semiconductor structure, in accordance with some embodiments of the present disclosure. FIGS. 3 to 26 are schematic cross-sectional views and plan views illustrating sequential operations of the method 200 shown in FIG. 2, in accordance with some embodiments of the present disclosure.

Referring to operation 201 of FIG. 2, a substrate 100 is provided, as shown in FIG. 2. In some embodiments, the substrate 100 includes a bulk material, such as bulk silicon. The substrate 100 may be a silicon-on-insulator (SOI) substrate. In some embodiments, the substrate 100 includes a suitable elementary semiconductor, such as germanium (Ge) or diamond. In some other embodiments, the substrate 100 includes a compound semiconductor, such as silicon germanium (SiGe), silicon carbide (SiC), gallium arsenide (GaAs), gallium nitride (GaN), indium phosphide (InP) or the like.

Figure 4A:
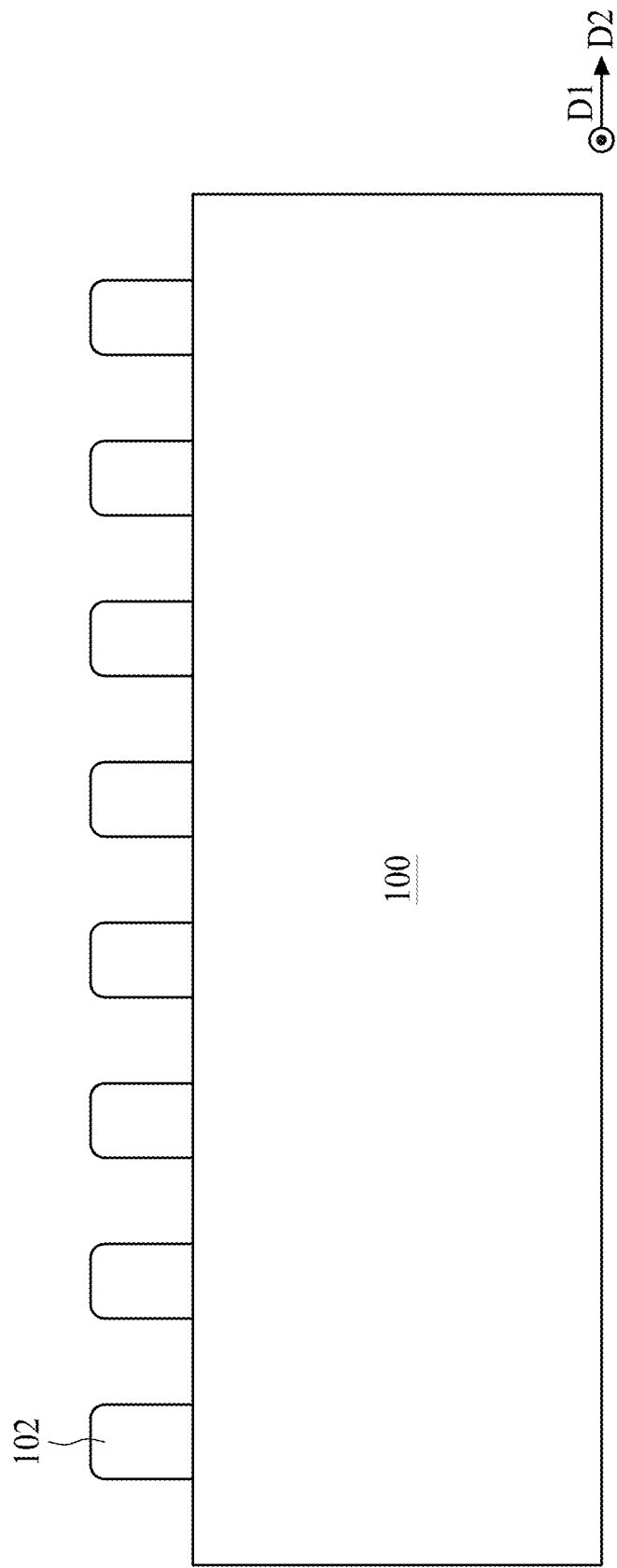
Figure 4B:
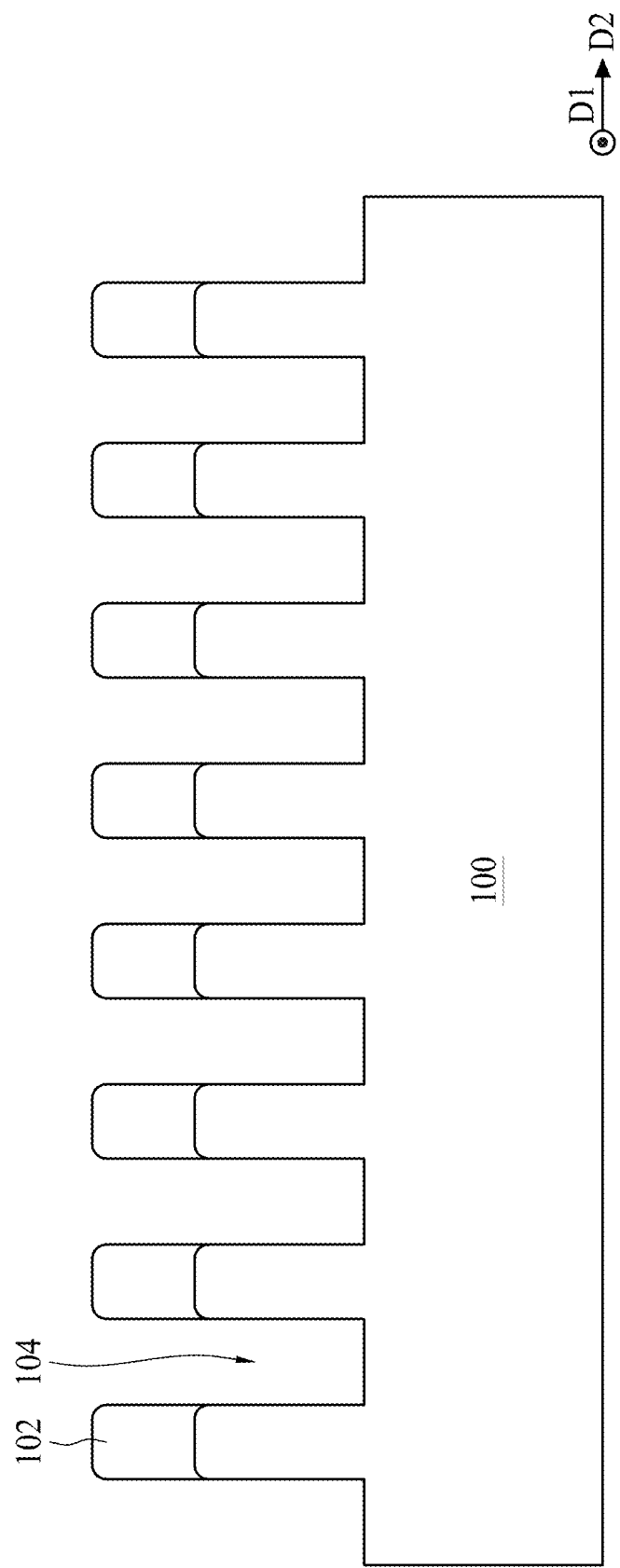
Figure 4C:
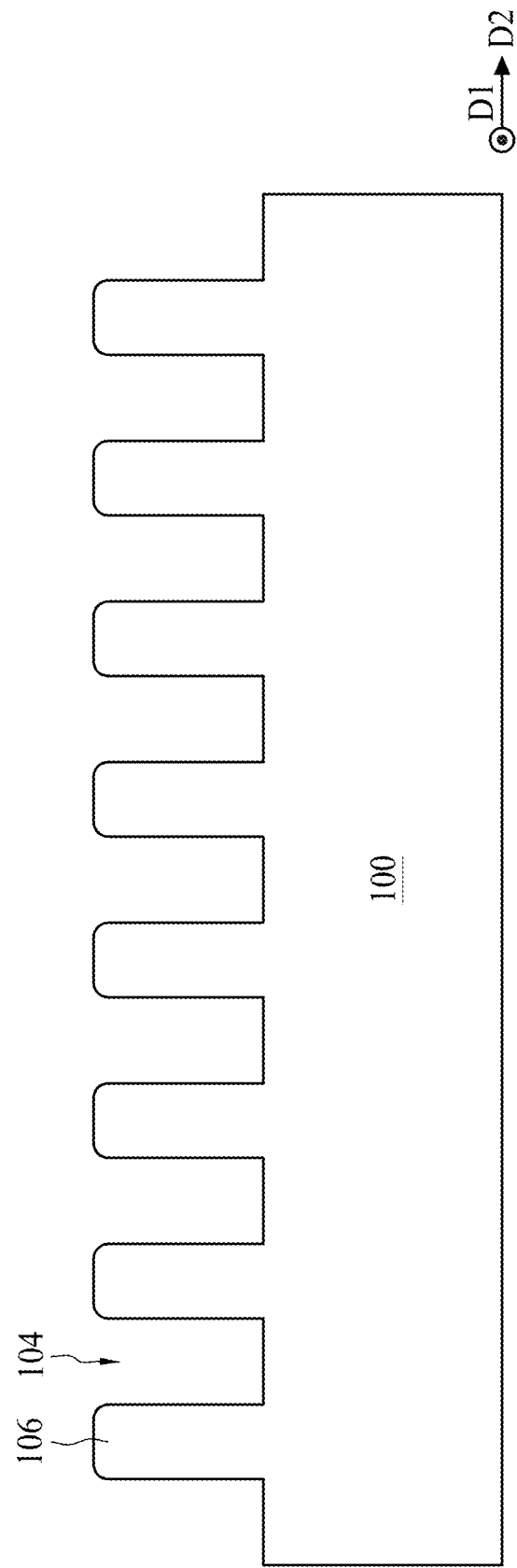
Figure 4D:
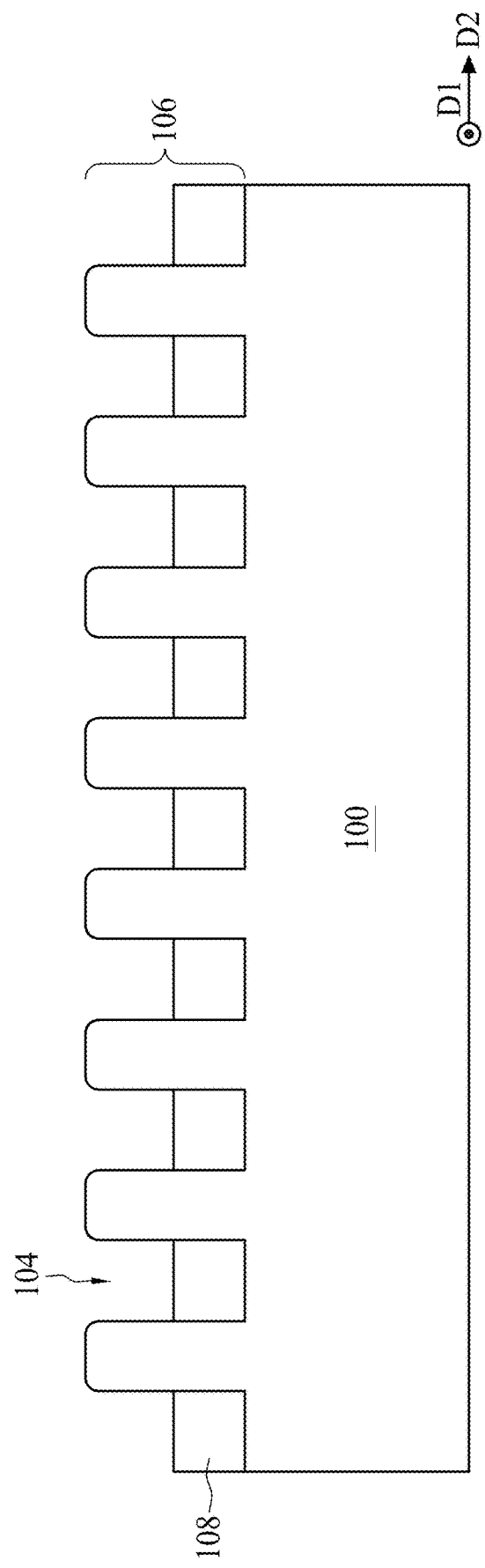

Referring to operation 203 of FIG. 2, a fin structure 106 is formed on the substrate 100, as shown in FIGS. 4A to 4E. A top portion of the substrate 100 may be patterned using one or more lithographic and etching operations. For example, a double-patterning or multi-patterning technique known in the art can be used to form the fin structure 106 on the substrate 100. Referring to FIG. 4A, a patterned mask 102 may be formed on the substrate 100. The patterned mask 102 may be a patterned photoresist in strips and include multiple openings exposing the underlying substrate 100. The patterned mask 102 is used as an etching mask during a subsequent etching operation. Referring to FIG. 4B, the substrate 100 is etched through the openings of the patterned mask 102 until multiple trenches 104 with a predetermined depth are formed. The trenches 104 may also be strips that are parallel to each other. Referring to FIG. 4C, after the patterned mask 102 is removed, multiple fin structures 106 are exposed. The fin structures 106 may be arranged in strips and protruded from a lower portion of the substrate 100. An ion implantation operation may be performed on the fin structures 106. For example, P-type dopants such as boron (B), gallium (Ga) and indium (In) ions, or N-type dopants such as phosphorus (P) and arsenic (As) ions may be doped into the substrate 100. Referring to FIG. 4D, a dielectric material may be deposited into the trenches 104 to fill the space between two adjacent fin structures 106. The dielectric material may include silicon oxide, silicon nitride, undoped silicate glass (USG), boro-silicate glass (BSG), tetraethyl orthosilicate (TEOS), or other suitable materials. An etching operation may be performed to etch the dielectric material in the trenches 104. As a result, top surfaces of the fin structures 106 may be higher than a top surface of the etched dielectric material. The dielectric material in the trenches 104 may form multiple insulating structures 108 between the fin structures 106. A portion of each of the fin structures 106 exposed from the insulating structures 108 may be referred to as a protruding fin.

Figure 4E:
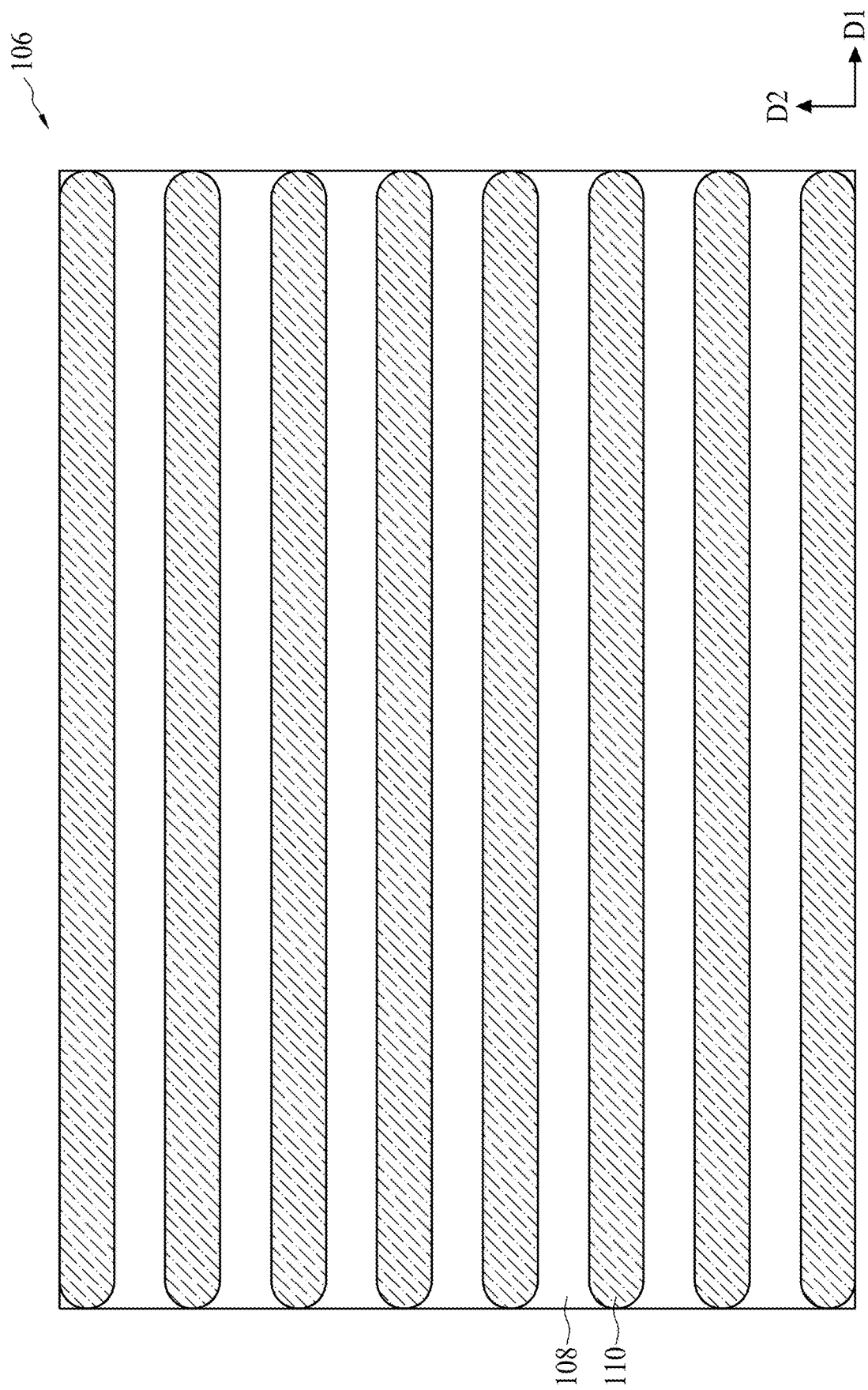
FIGS. 4E, 5B and 12B are schematic plan views of FIGS. 4D, 5A and 12A, respectively, in accordance with some embodiments of the present disclosure.

FIG. 4E is a schematic plan view of FIG. 4D. In some embodiments, the fin structures 106 and the insulating structures 108 extend along the first direction D1. In some embodiments, the fin structures 106 and the insulating structures 108 are alternately arranged with each other along a second direction D2 perpendicular to the first direction D1. The fin structures 106 may be referred to as "oxide definition" or "oxide diffusion" (OD) regions. The term oxide definition region refers to an active region for a transistor, i.e., an area where a source, a drain, and a channel under a gate of the transistor are formed. The fin structures 106 containing doped ions may function as multiple active regions or well regions over the substrate 100 and are electrically isolated from one another by the insulating structures 108.

Figure 5A:
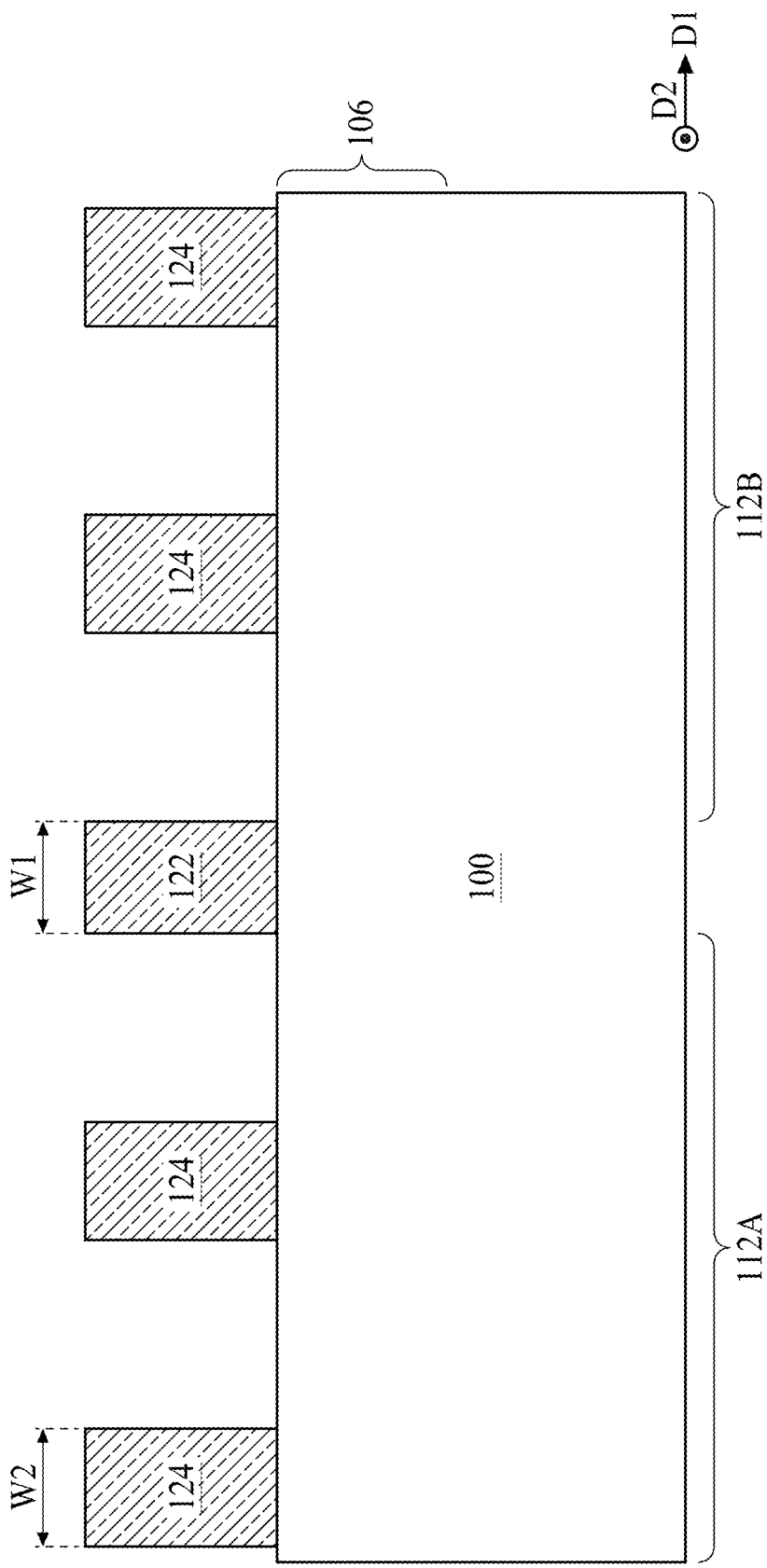

Referring to operation 205 of FIG. 2, multiple dummy gates 122 and 124 are formed on the fin structure 106, as shown in FIG. 5A. The dummy gates 122 and 124 may be formed by depositing a polycrystalline-silicon (poly-Si) layer or a polycrystalline-silicon-germanium (poly-SiGe) layer on the fin structure 106 using a chemical vapor deposition (CVD) operation, and/or other suitable methods. A lithographic operation and an etching operation may be used to remove portions of the polycrystalline-silicon layer to form the dummy gates 122 and 124 shown in FIG. 5A. In some embodiments, the dummy gates 122 and 124 are at least partially located over the fin structures 106; that is, the active regions or the oxide definition regions. The dummy gates 122 and 124 formed over the fin structure 106 may be used in subsequent operations. For example, in a "gate last" or "replacement gate" technique, the dummy gates 124 (also called sacrificial gates) are initially formed. After various operations are finished, portions or a whole of the dummy gates 124 will be removed and replaced with one or more materials of replacement gates. In some embodiments, the dummy gate 122 may be replaced with a CPODE structure. In some embodiments, a width W1 of the dummy gate 122 is equal to a width W2 of the dummy gate 124. In some other embodiments, the width W1 of the dummy gate 122 is different from the width W2 of the dummy gate 124.

Figure 5B:
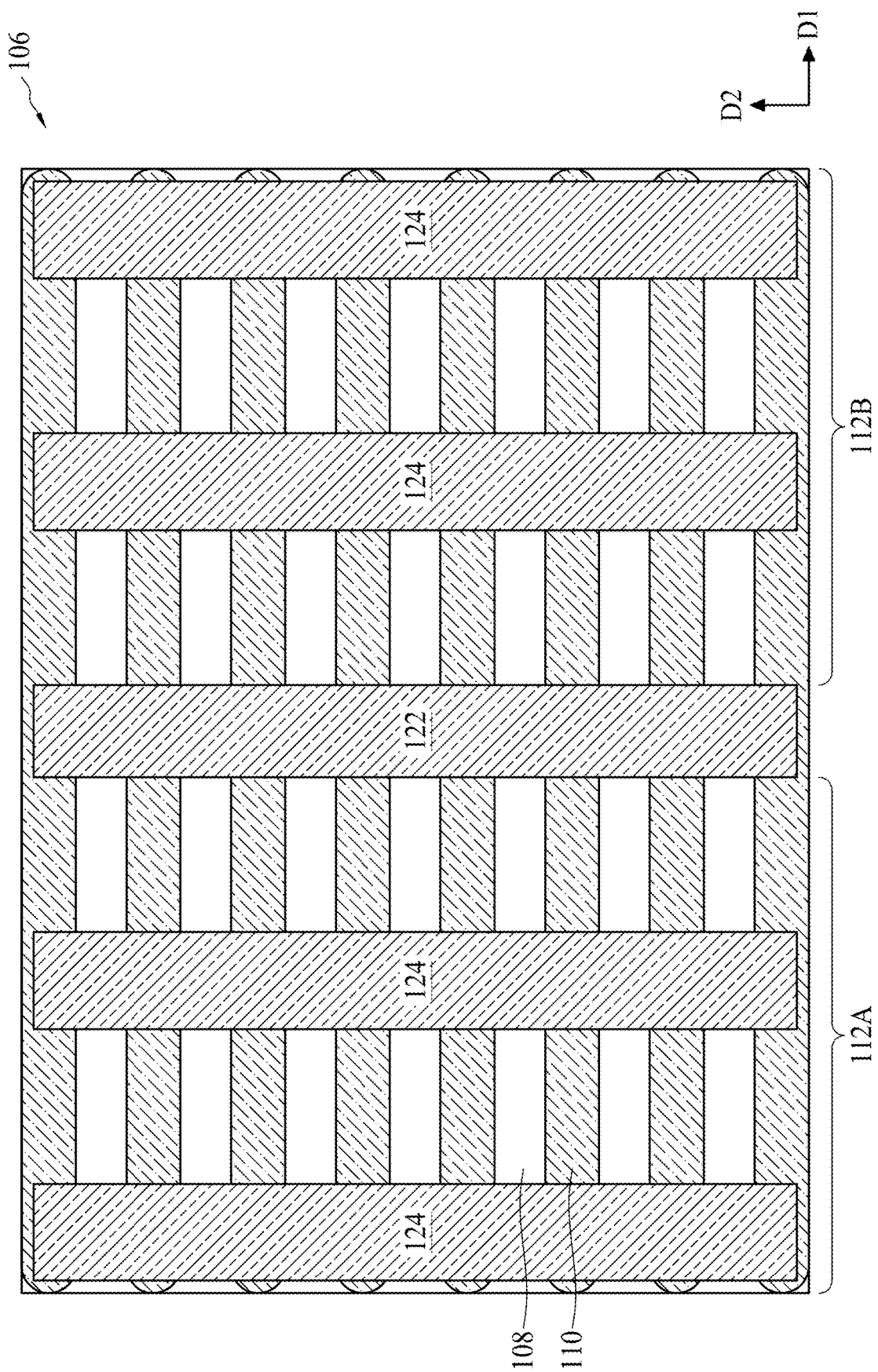

FIG. 5B is a schematic plan view of FIG. 5A. In some embodiments, the dummy gate 122 is formed between two dummy gates 124. The dummy gates 122 and 124 may extend along the second direction D2 perpendicular to the fin structures 106. In some embodiments, portions of the fin structures 106 on one side of the dummy gate 122 are designed as a first active region 112A and other portions of the fin structures 106 on the other side of the dummy gate 122 are designed as a second active region 112B. The first active region 112A and the second active region 112B are two predetermined active regions and are connected at this stage, as shown in FIGS. 5A and 5B.

Figure 6:
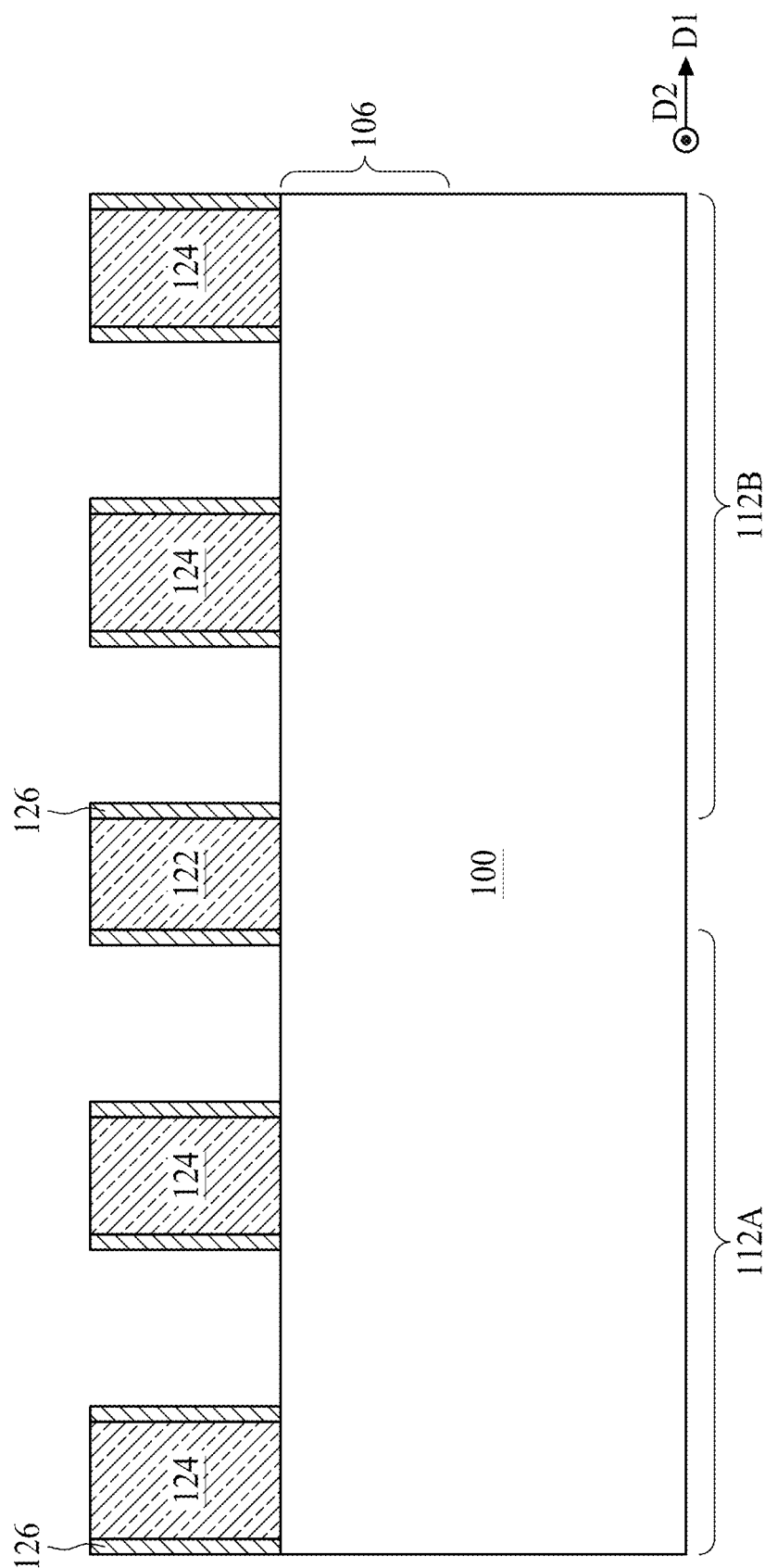

Referring to operation 207 of FIG. 2, a gate spacer 126 is deposited on each of the dummy gates 122 and 124, as shown in FIG. 6. The gate spacers 126 may be formed by depositing a dielectric material over the dummy gates 122, 124 and the fin structure 106 using CVD, physical vapor deposition (PVD), atomic layer deposition (ALD), and/or other suitable methods. In some embodiments, the dielectric material of the gate spacers 126 includes silicon oxide, silicon nitride, silicon oxynitride, silicon carbide, or other suitable materials. An etch operation may be used to remove horizontal portions of the dielectric material to leaving the vertical portions of the dielectric material on sidewalls of the dummy gates 122 and 124, thereby forming the gate spacers 126 as shown in FIG. 6. In some embodiments, the gate spacer 126 is formed along a sidewall of the dummy gate 122 or 124.

Figure 7:
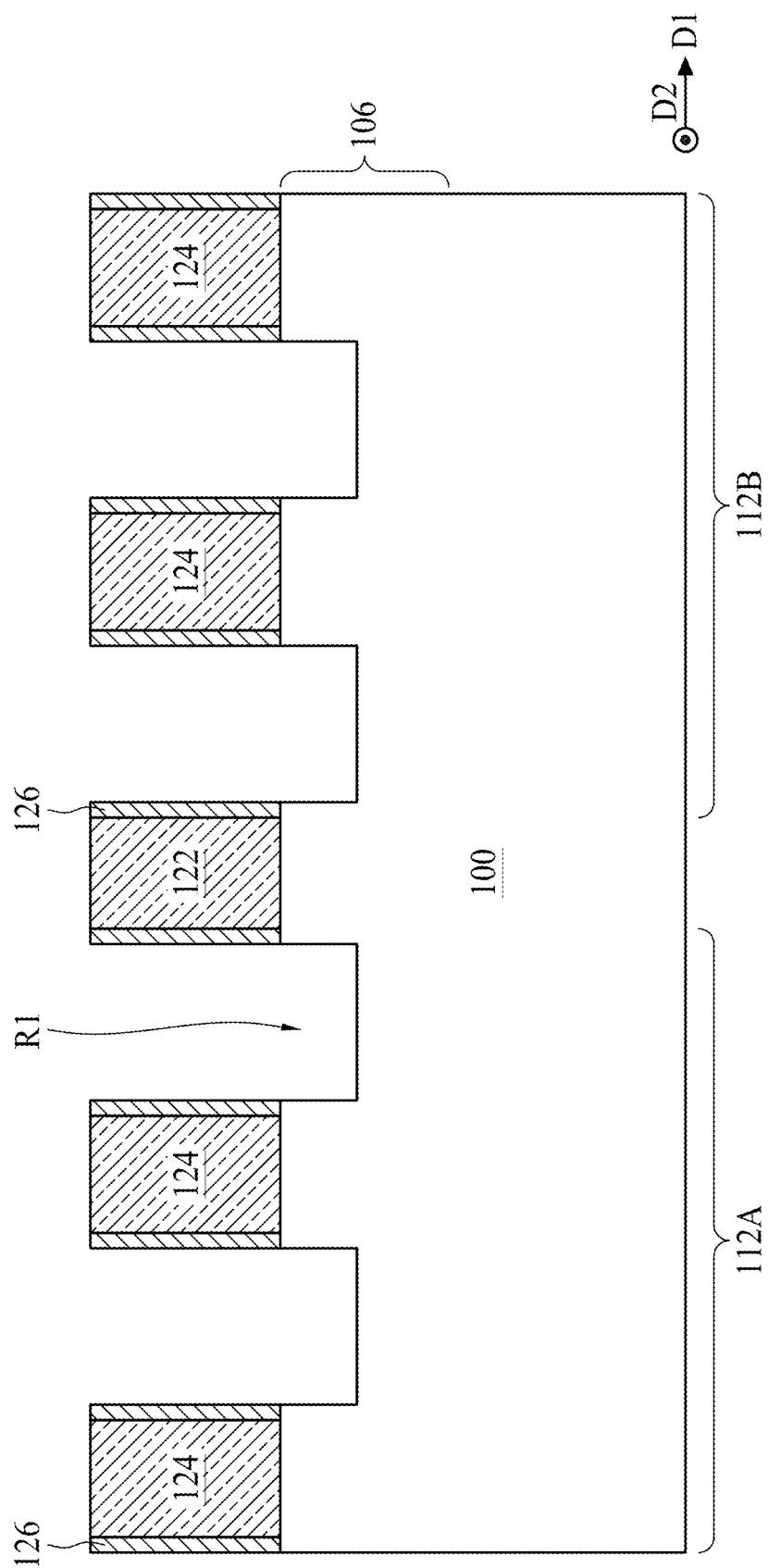

Referring to operation 209 of FIG. 2, multiple recesses R1 are formed in the fin structure 106, as shown in FIG. 7. The formation of the recesses R1 includes at least a lithographic operation and an etching operation. The etching operation may include a reactive ion etching (RIE), a wet etching, and/or other suitable methods. Portions of the fin structure 106 are removed by an isotropic or an anisotropic etching to form multiple recesses R1 adjacent to the gate spacers 126. A profile of the recesses R1 may be substantially triangle, trapezoid, pentagon, or hexagon shape depending on etching parameters of the etching operation. In some embodiments, the etching operation partially etches the fin structure 106 with the dummy gates 122, 124 and the gate spacers 126 serving as an etching mask. A portion of the recesses R1 may extend a predetermined depth of the fin structure 100. In some embodiments, the recess R1 is formed between the gate spacers 126 of adjacent dummy gates 122 and 124 or between adjacent two dummy gates 124. The recesses R1 may extend along the second direction D2.

Figure 8:
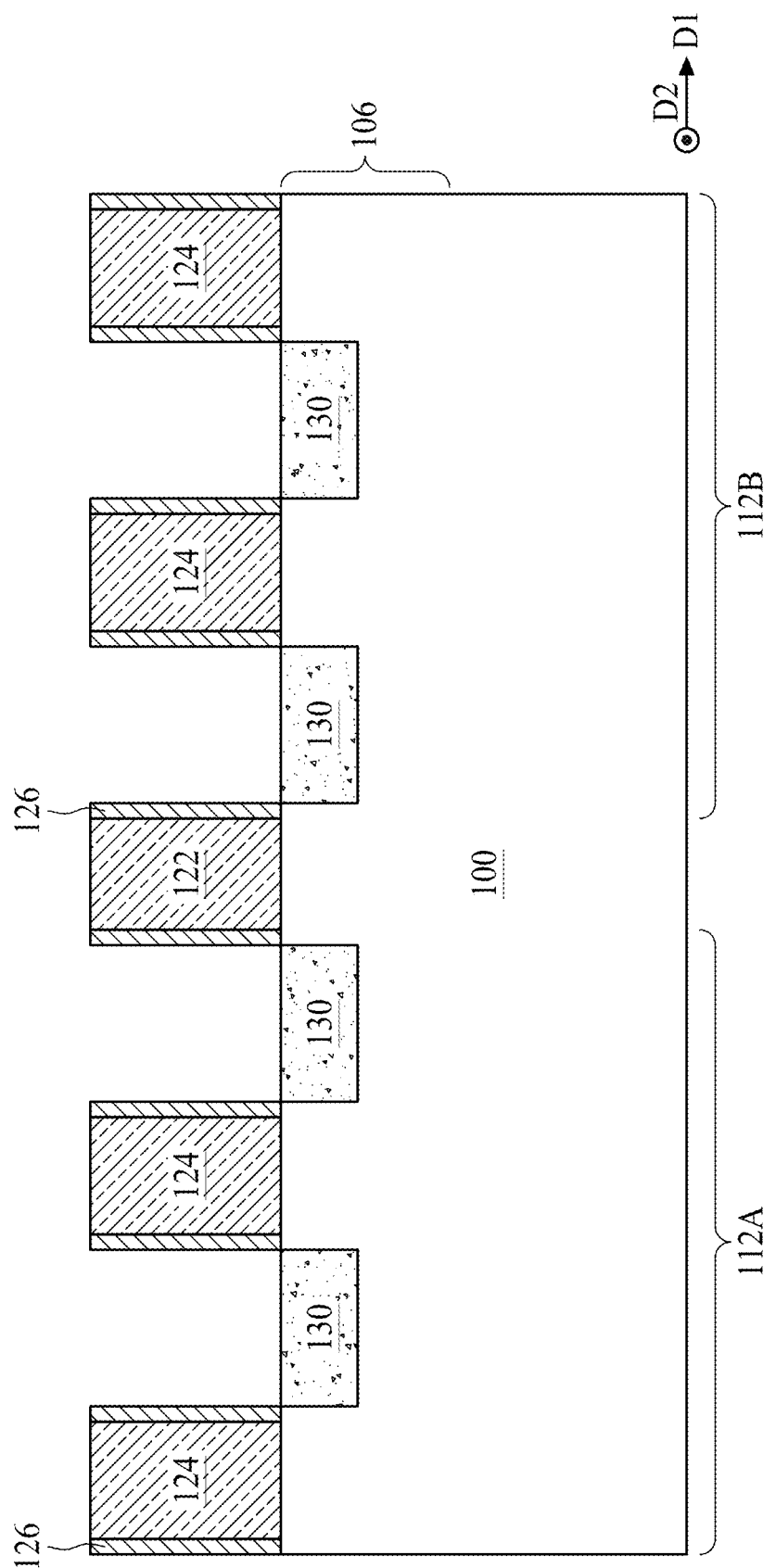

Referring to operation 211 of FIG. 2, an epitaxial feature 130 is formed in the recess R 1, as shown in FIG. 8. An epitaxial growth operation may be performed to form multiple epitaxial features 130 on the fin structure 106 and each epitaxial feature 130 is formed in each recess R1. The epitaxial growth operation may include selective epitaxy growth (SEG), molecular-beam epitaxy (MBE), vapor-phase epitaxy (VPE), liquid-phase epitaxy (LPE), and/or other suitable methods. In some embodiments, the epitaxial growth operation uses gaseous and/or liquid precursors, which interact with a composition of the fin structure 106. In some embodiments, the formation of the epitaxial features 130 includes doping of N-type or P-type dopants and hence the epitaxial features 130 are conductive. In some embodiments, the epitaxial features 130 are in-situ doped or undoped during the epitaxial growth operation. For example, when undoped during the epitaxial growth operation, the epitaxial features 130 are doped in a subsequent operation. The epitaxial features 130 may be further exposed to annealing, such as a rapid thermal annealing (RTA) operation, to diffuse dopants within the epitaxial features 130.

A silicide (not shown) such as cobalt-silicide (CoSi), nickel silicide (NiSi) or tungsten silicide (WSi) may be formed on a top surface of each epitaxial feature 130. The silicide may include a self-aligned silicide (salicide). In some embodiments, the dummy gate 124 is between two consecutive epitaxial features 130. In some embodiments, the two consecutive epitaxial features 130 on one side of the dummy gate 122 may function as the source/drain features of a transistor formed in subsequent operations. In some embodiments, the two consecutive epitaxial features 130 on the other side of the dummy gate 122 may function as the source/drain features of another transistor formed in subsequent operations.

Figure 9:
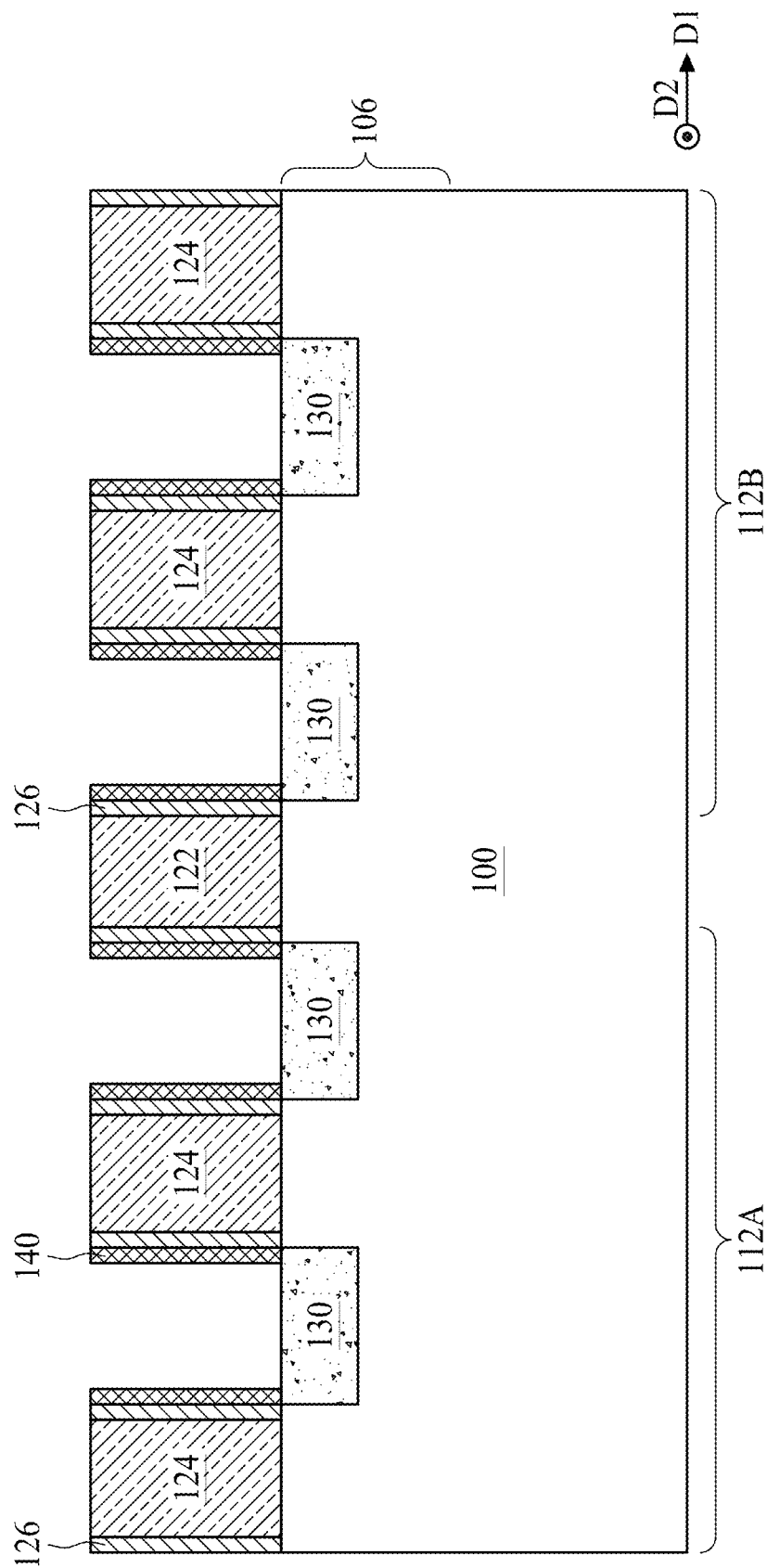

Referring to operation 213 of FIG. 2, an etch stop layer 140 is formed on the gate spacer 126 and the epitaxial feature 130, as shown in FIG. 9. The etch stop layer 140 may be formed by depositing a dielectric material onto the gate spacer 126 and the epitaxial feature 130 using CVD, PVD, ALD, and/or other suitable methods. In some embodiments, the dielectric material of the etch stop layer 140 includes silicon oxide, silicon nitride, silicon oxynitride, silicon carbide, silicon oxycarbide, or other suitable materials. An etch operation may be used to remove portions of the dielectric material to form multiple etch stop layers 140 shown in FIG. 9. In some embodiments, the etch stop layer 140 may be formed along a sidewall of the gate spacer 126. As such, the dummy gates 122 and 124 are surrounded by the etch stop layers 140. In some embodiments, the epitaxial feature 130 is completely covered by the etch stop layer 140. In some other embodiments, the epitaxial feature 130 is partially covered by the etch stop layer 140 when the etch operation removes a portion of the etch stop layer 140 over the epitaxial feature 130. The etch stop layer 140 may be a contact etch stop layer (CESL) used for subsequent operations. The CESL is formed on sidewalls of the dummy gates 122, 124 and on the epitaxial features 130.

Figure 10:
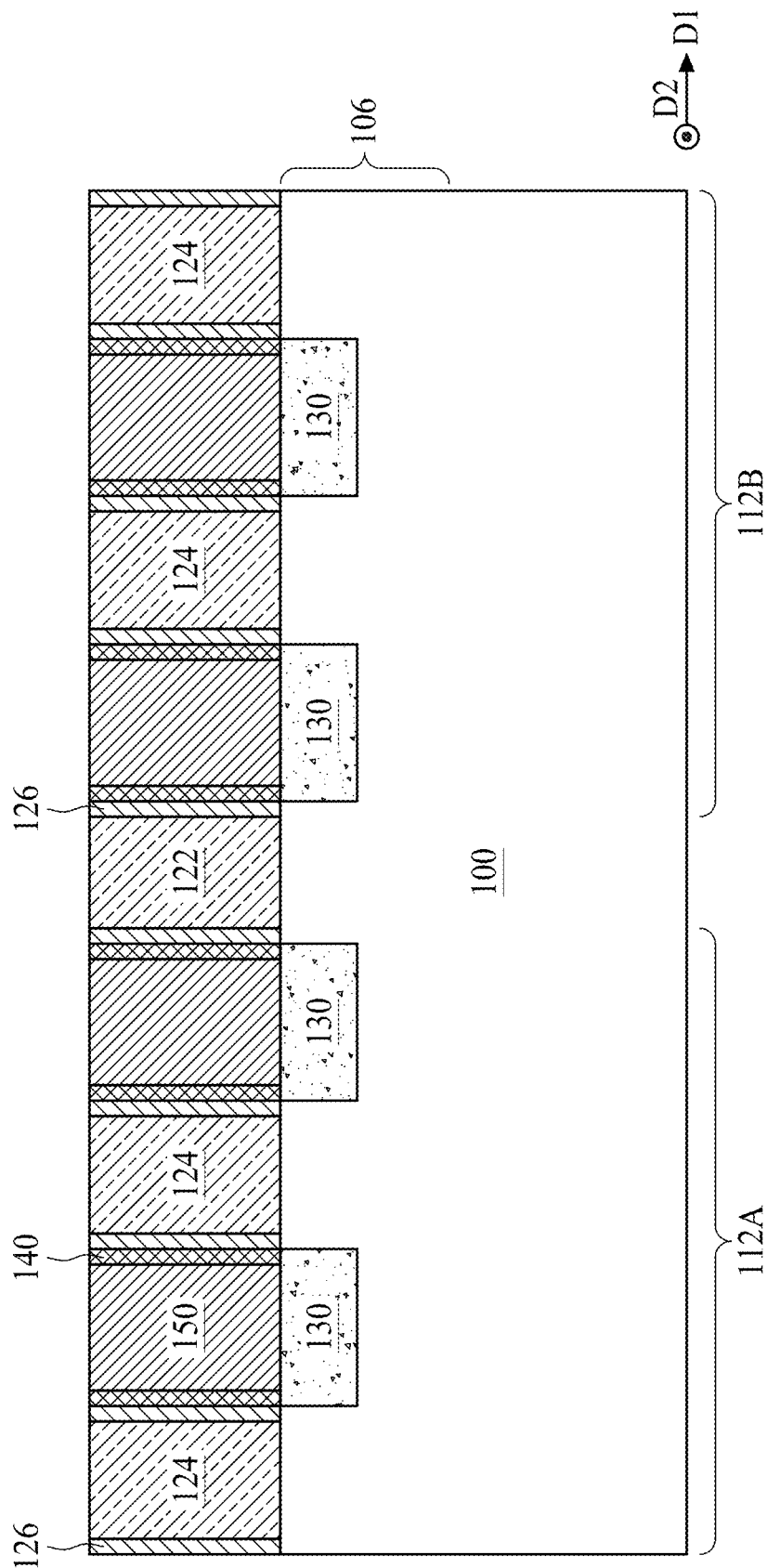

Referring to operation 215 of FIG. 2, an inter-layer dielectric (ILD) layer 150 is formed on the etch stop layer 140 and the epitaxial feature 130, as shown in FIG. 10. The ILD layer 150 may be formed by depositing an insulating material onto the dummy gates 122, 124 and the etch stop layers 140 using spin-on coating, CVD, PVD, ALD, and/or other suitable methods. In some embodiments, the insulating material of the ILD layer 150 includes silicon oxide, silicon nitride, undoped silicate glass (USG), boro-silicate glass (BSG), a low-k material, tetraethyl orthosilicate (TEOS), or other suitable materials. After the space between the dummy gates 122 and 124 and between two adjacent dummy gates 124 are completely filled with the insulating material, a CMP operation may be used to remove the insulating material over the dummy gates 122 and 124. As such, multiple ILD layer 150 are formed and alternately arranged with the dummy gates 122, 124. After the CMP operation, top surfaces of the dummy gates 122 and 124 are exposed. A top surface of the ILD layer 150 is substantially coplanar with a top surface of dummy gates 122 and 124.

Figure 11A:
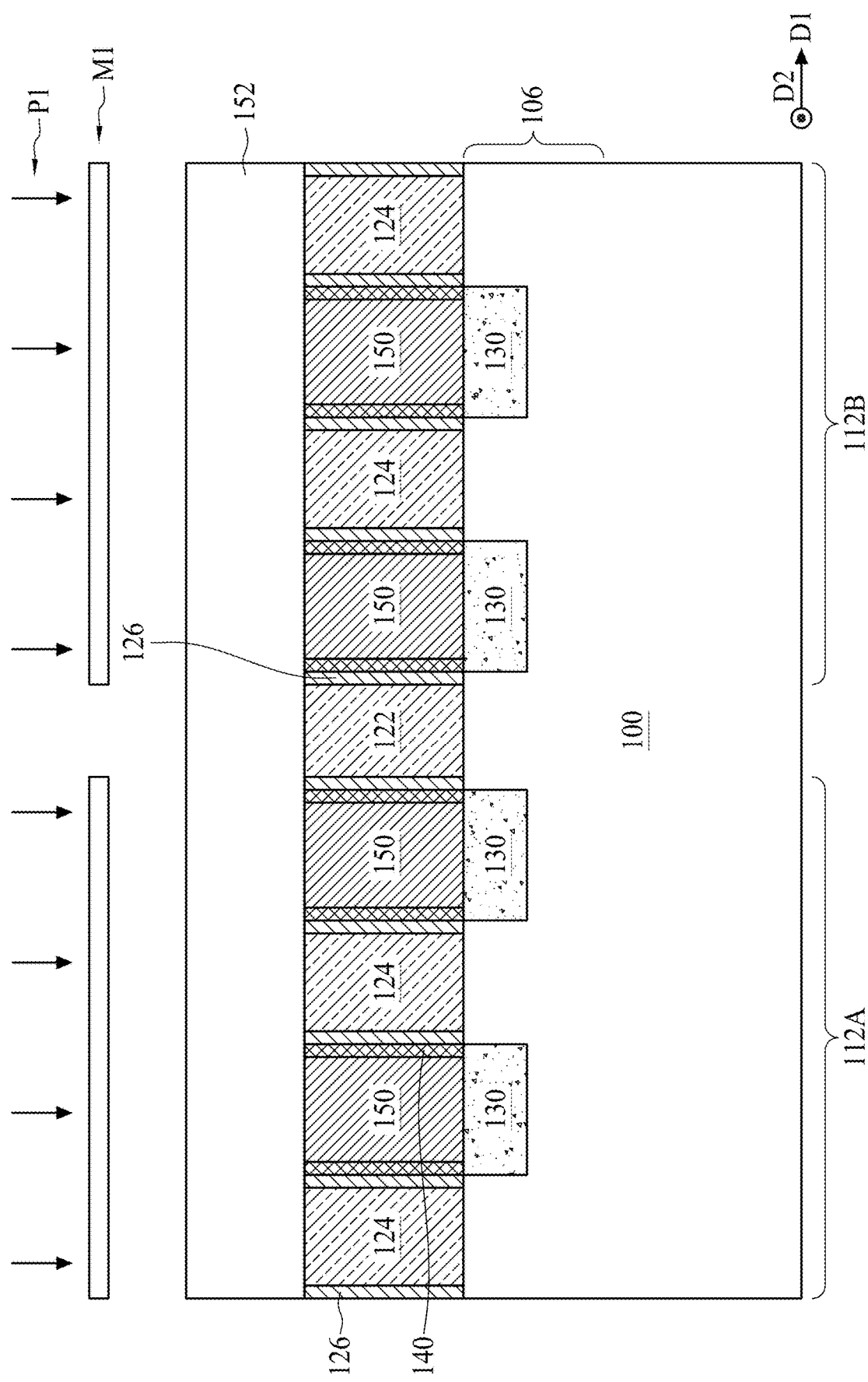
Figure 11B:
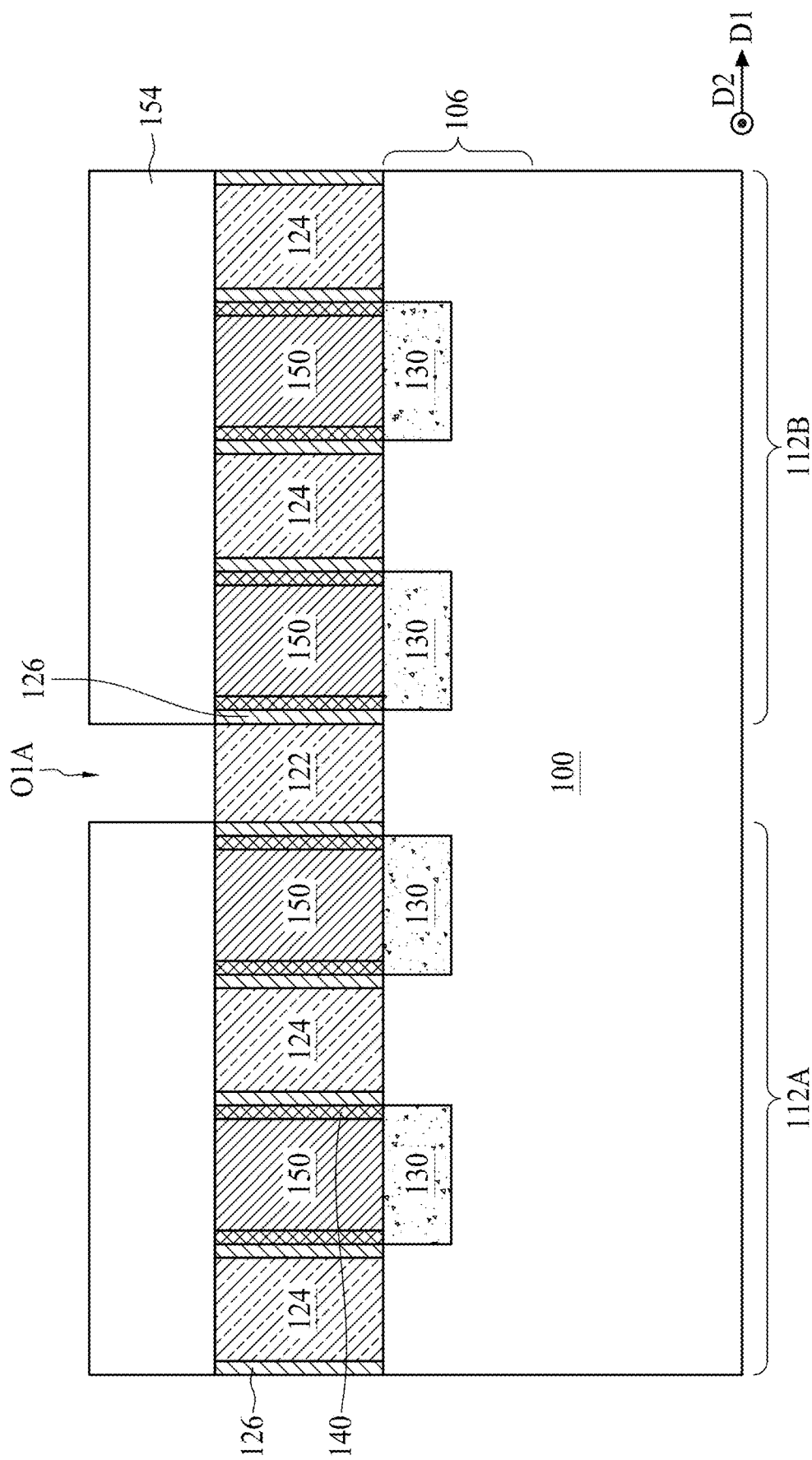

Referring to operation 217 of FIG. 2, a first patterned photoresist layer 154 is formed on the dummy gates 122 and 124, as shown in FIGS. 11A and 11B. Referring to FIG. 11A, a first photoresist layer 152 is coated to cover the etch stop layer 140, the ILD layer 150 and the dummy gates 122 and 124. Subsequently, the first photoresist layer 152 is exposed to a first radiation P1 via a photomask M1. After exposure, portions of the first photoresist layer 152 are developed, and the first patterned photoresist layer 154 is formed, as shown in FIG. 11B. In some embodiments, the first patterned photoresist layer 154 includes an opening O1A that exposes the dummy gate 122.

Figure 12A:
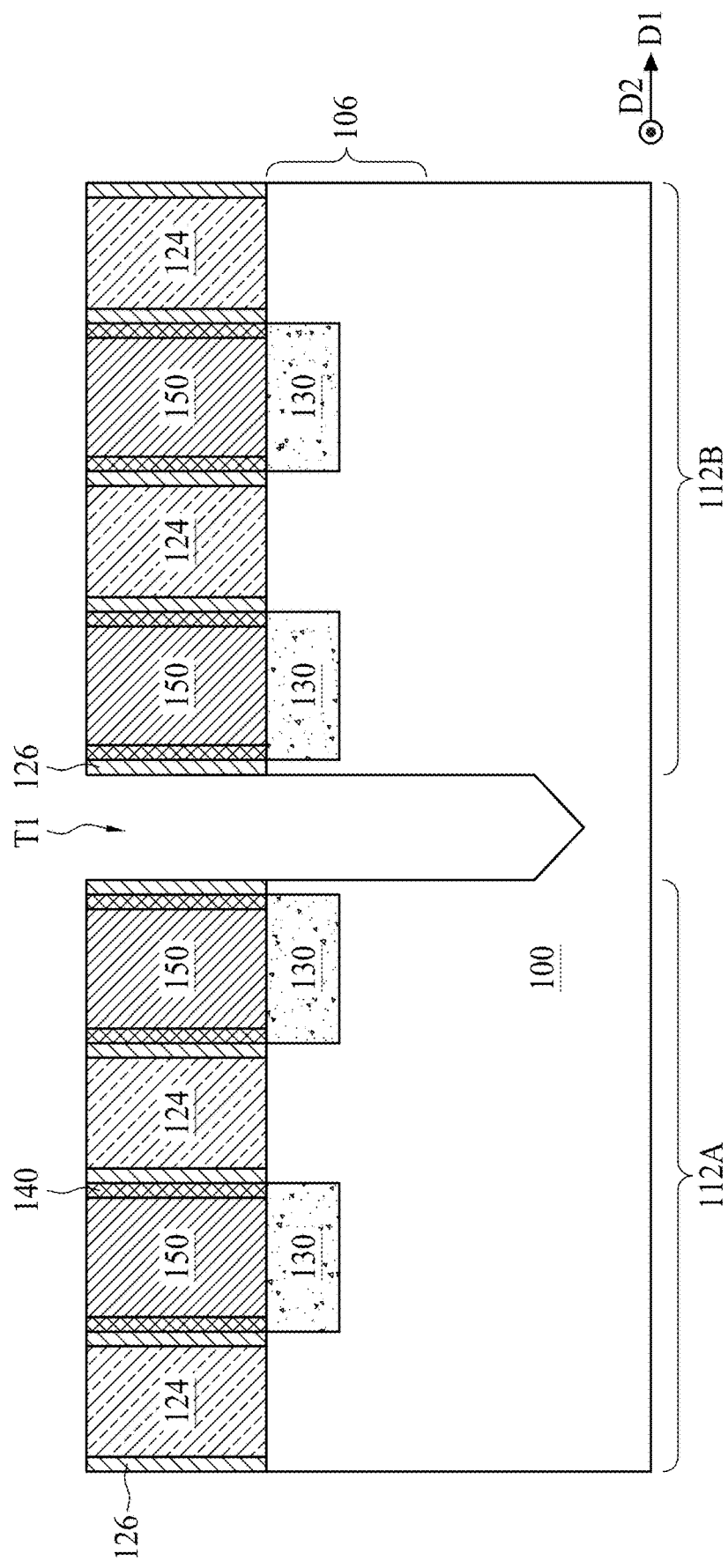
Figure 12B:
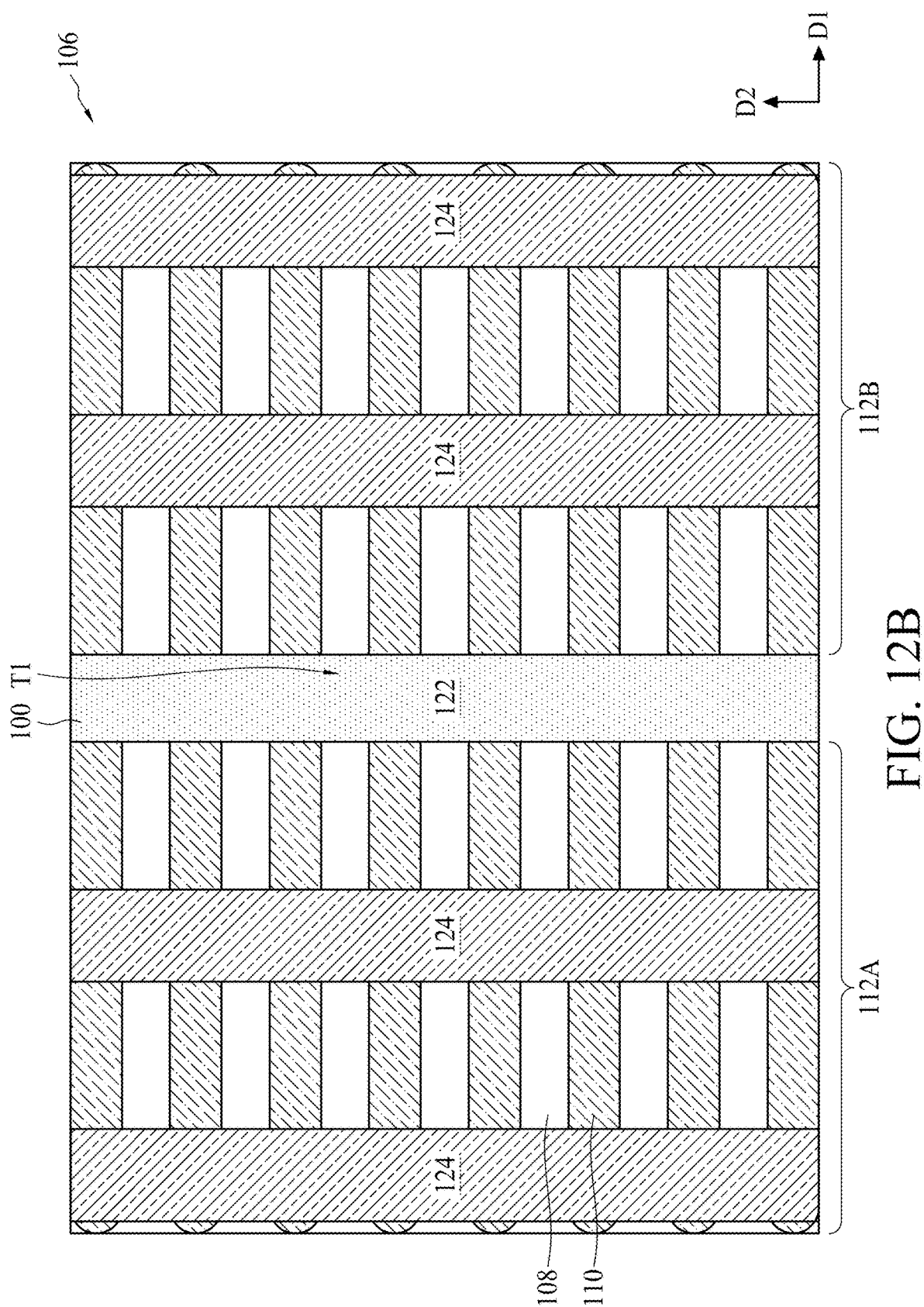

Referring to operation 219 of FIG. 2, a trench T1 is formed to penetrate the dummy gate 122, as shown in FIGS. 12A and 12B. In some embodiments, the formation of the trench T1 includes multiple etching operations such as continuous dry etching or RIE using the first patterned photoresist layer 154 as an etching mask. In some embodiments, the etching operations vertically remove the dummy gate 122 and portions of the fin structure 106 and the substrate 100 underneath the dummy gate 122. In such embodiments, the trench T1 penetrates the fin structure 106 and extends to a depth of the substrate 100.

FIG. 12B is a schematic plan view of FIG. 12A. Some elements are omitted in FIG. 12B for clarity of the drawing. Comparing FIGS. 5B and 12B, since the fin structure 106 is penetrated by the trench T1, the first active region 112A may be separated from the second active region 112B by the trench T1. In other words, the trench T1 separates one active region into two active regions such as the first active region 112A and the second active region 112B. The trench T1 may be used to form a CPODE structure. In some embodiments, the trench T1 cuts through at least two neighboring fins 130 (i.e., oxide definition regions). After the dummy gate 122 and the fin structure 106 are penetrated by the trench T1, the substrate 100 may be exposed by the trench T1, as shown in FIG. 12B.

Referring to operation 221 of FIG. 2, the trench T1 is filled with multiple dielectric layers, as shown in FIGS. 13A to 13D. In some embodiments, the dielectric layers include a multilayer structure formed of one or more dielectric layers, such as an oxide-nitride-oxide (ONO) structure. The formation of the dielectric layers includes one or more deposition, lithographic and etching operations.

Figure 13A:
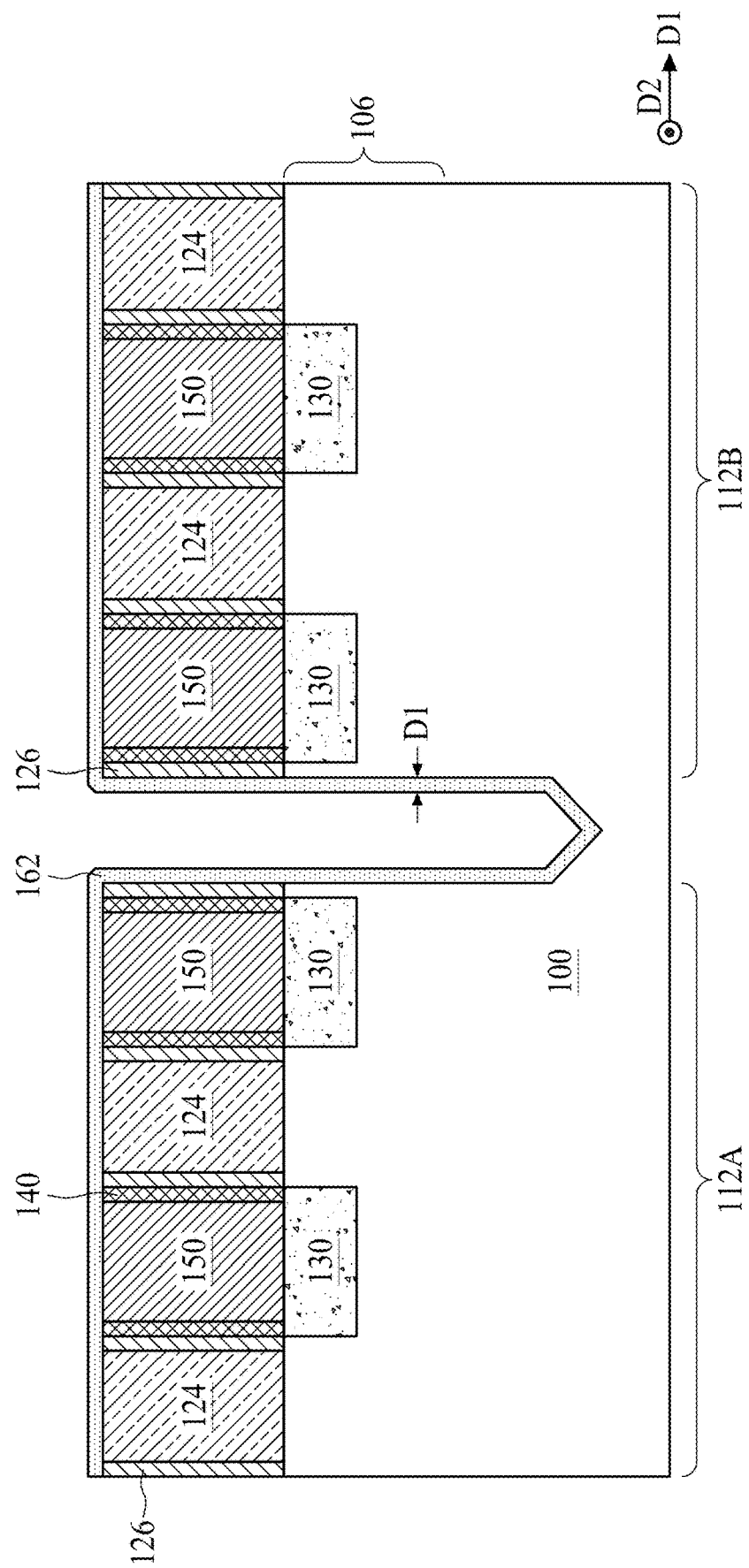

Referring to FIG. 13A, a first dielectric layer 162 is deposited over the etch stop layer 140, the ILD layer 150 and the dummy gates 124, and along sidewalls of the trench T1. The first dielectric layer 162 may be formed using CVD, ALD, and/or other suitable methods. The first dielectric material 162 may include silicon oxide or other suitable materials. The first dielectric material 162 may be deposited along sidewalls of the gate spacer 126, the fin structure 106 and the substrate 100 in a conformal manner. In some embodiments, the first dielectric material 162 has a thickness D1 of about 10 angstroms (Å) to about 30 Å.

Figure 13B:
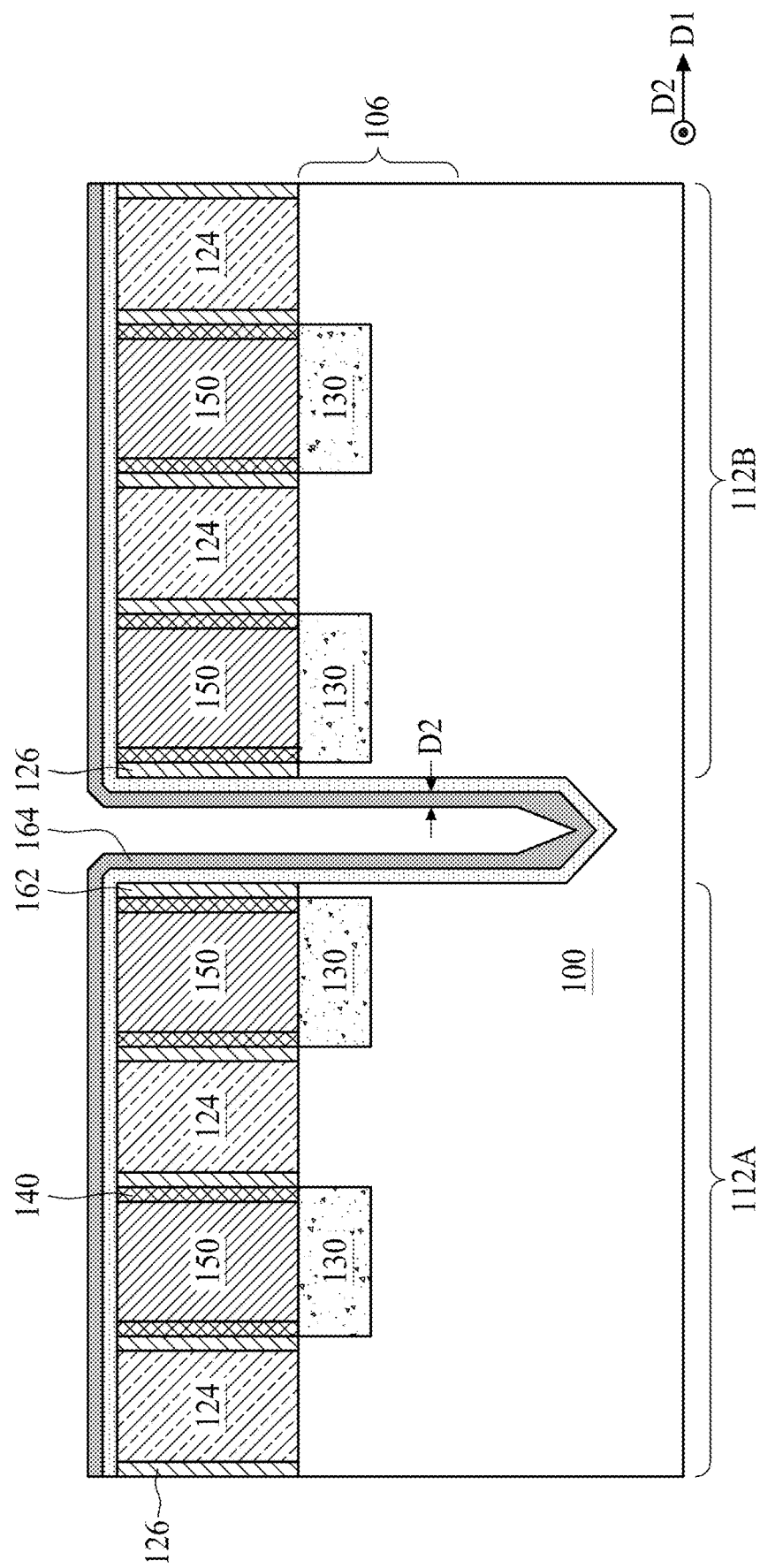

Referring to FIG. 13B, a second dielectric layer 164 is deposited over the first dielectric layer 162 using CVD, ALD, and/or other suitable methods. The second dielectric layer 164 may include silicon nitride or other suitable materials. The second dielectric layer 164 may be deposited over the first dielectric layer 162 in a conformal manner. In some embodiments, the second dielectric layer 164 has a thickness D2 of about 30 Å to about 50 Å.

Figure 13C:
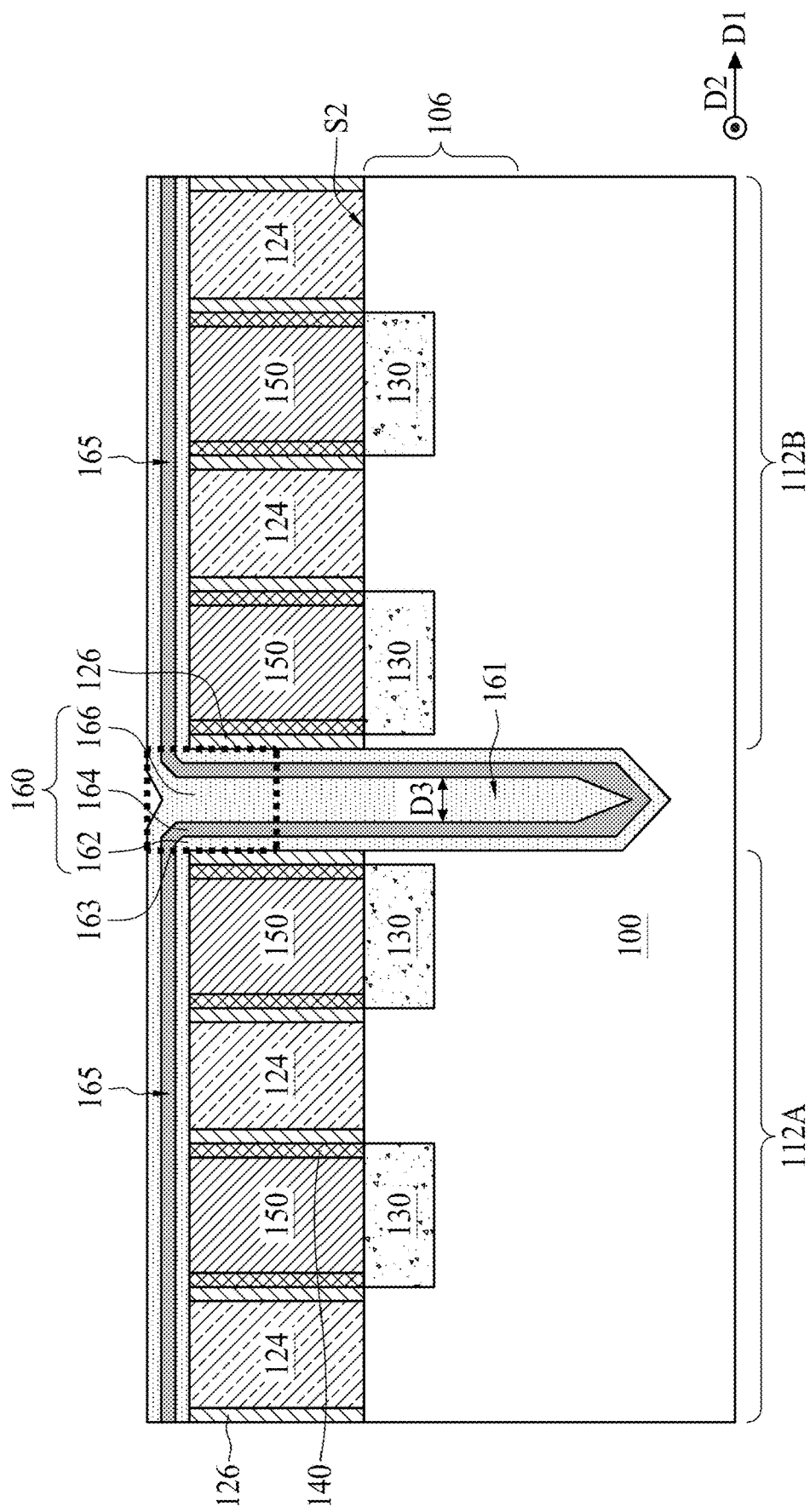

Referring to FIG. 13C, a third dielectric layer 166 is deposited over the second dielectric layer 164 using CVD, ALD, and/or other suitable methods. The third dielectric layer 166 may include silicon oxide or other suitable materials. The third dielectric layer 166 may be deposited over the second dielectric layer 164 in a conformal manner. In some embodiments, the third dielectric layer 166 has a thickness D3 of about 20 Å to about 40 Å. The first dielectric layer 162, the second dielectric layer 164 and the third dielectric layer 166 may form a dielectric stack 160 in the trench T1. In some embodiments, the dielectric stack 160 substantially fills the trench T1. In some other embodiments, a void is left in the trench T1 after the dielectric stack 160 is formed in the trench T1. The first dielectric layer 162 and the second dielectric layer 164 may have a U-shape profile, but the configuration thereof is not limited herein. In some embodiments, the dummy gate 124, the gate spacer 126, the etch stop layer 140 and the ILD layer 150 are covered by the dielectric stack 160. In some embodiments, the dielectric stack 160 includes a lower portion 161, an upper portion 163 over the lower portion 161 and pair of horizontal portions 165 on opposite sides of the upper portion 163.

Figure 13D:
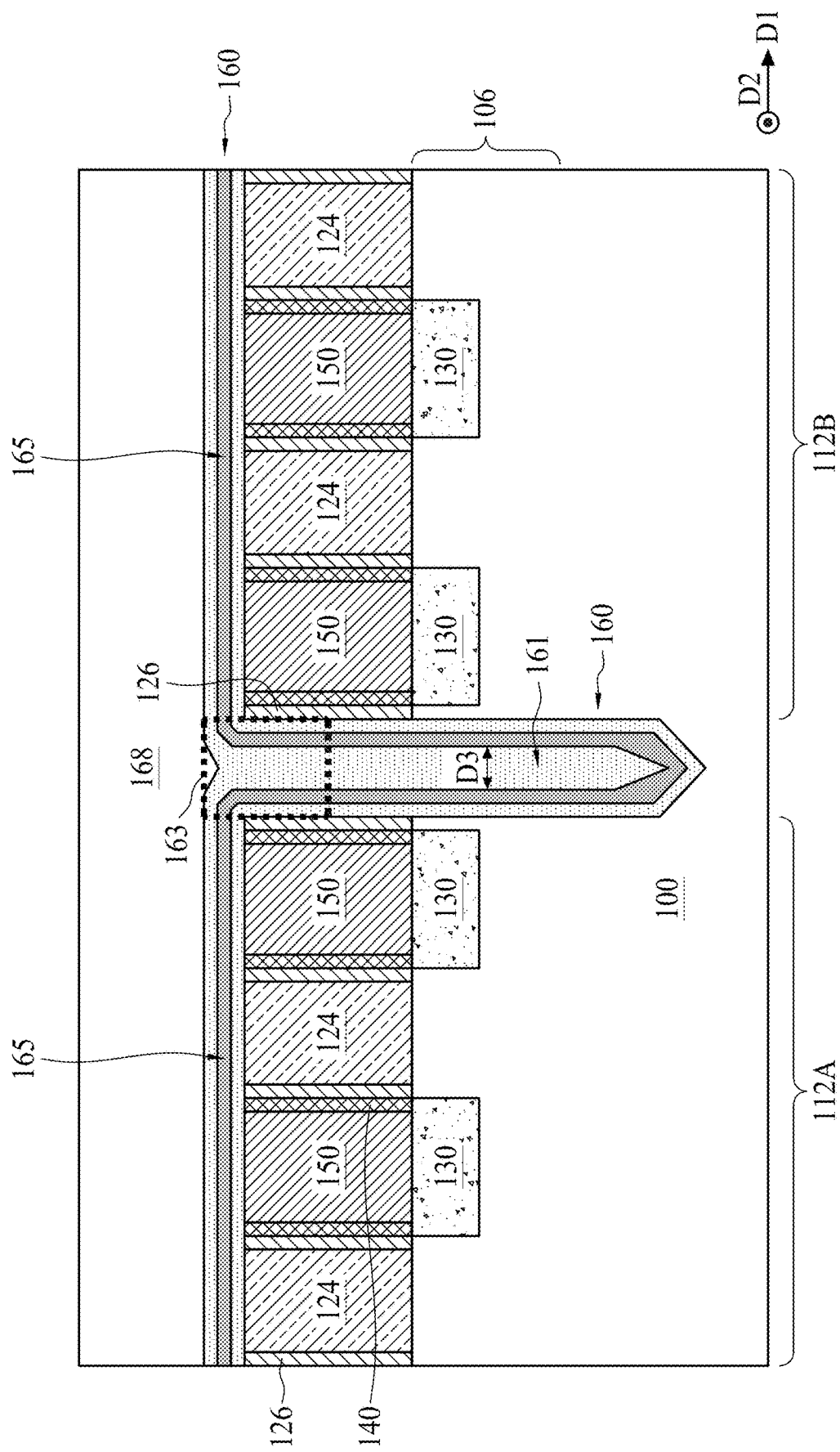

Referring to FIG. 13D, a cap layer 168 is deposited over the dielectric stack 160 using spin-on coating, CVD, ALD, and/or other suitable methods. The cap layer 168 may include silicon nitride, silicon oxynitride, or other suitable materials. In some embodiments, the cap layer 168 does not include any silicon oxide. An etch operation or a CMP operation may be used to planarize the cap layer 168 to make the cap layer 168 have a flat top surface.

Figure 14A:
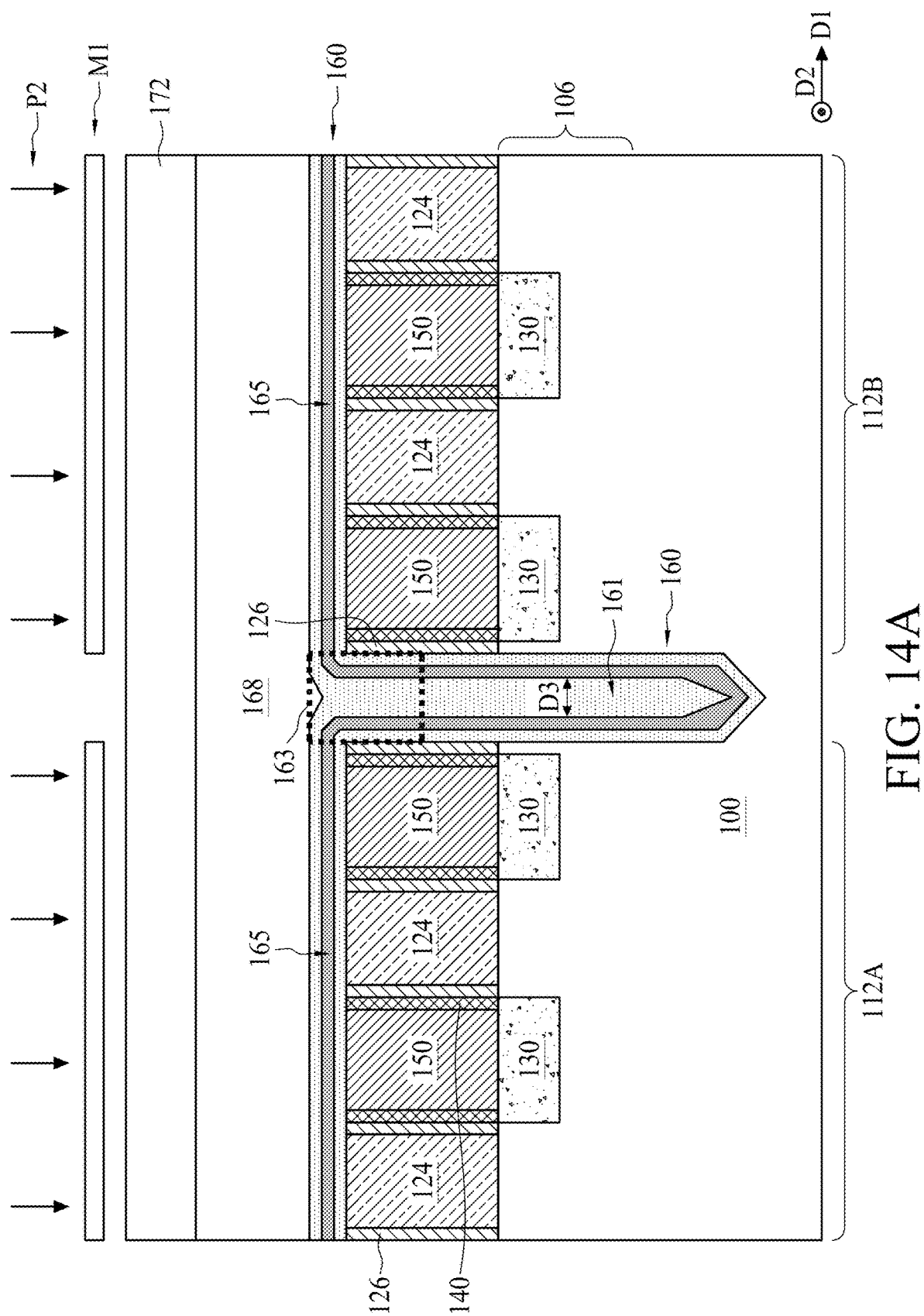
Figure 14B:
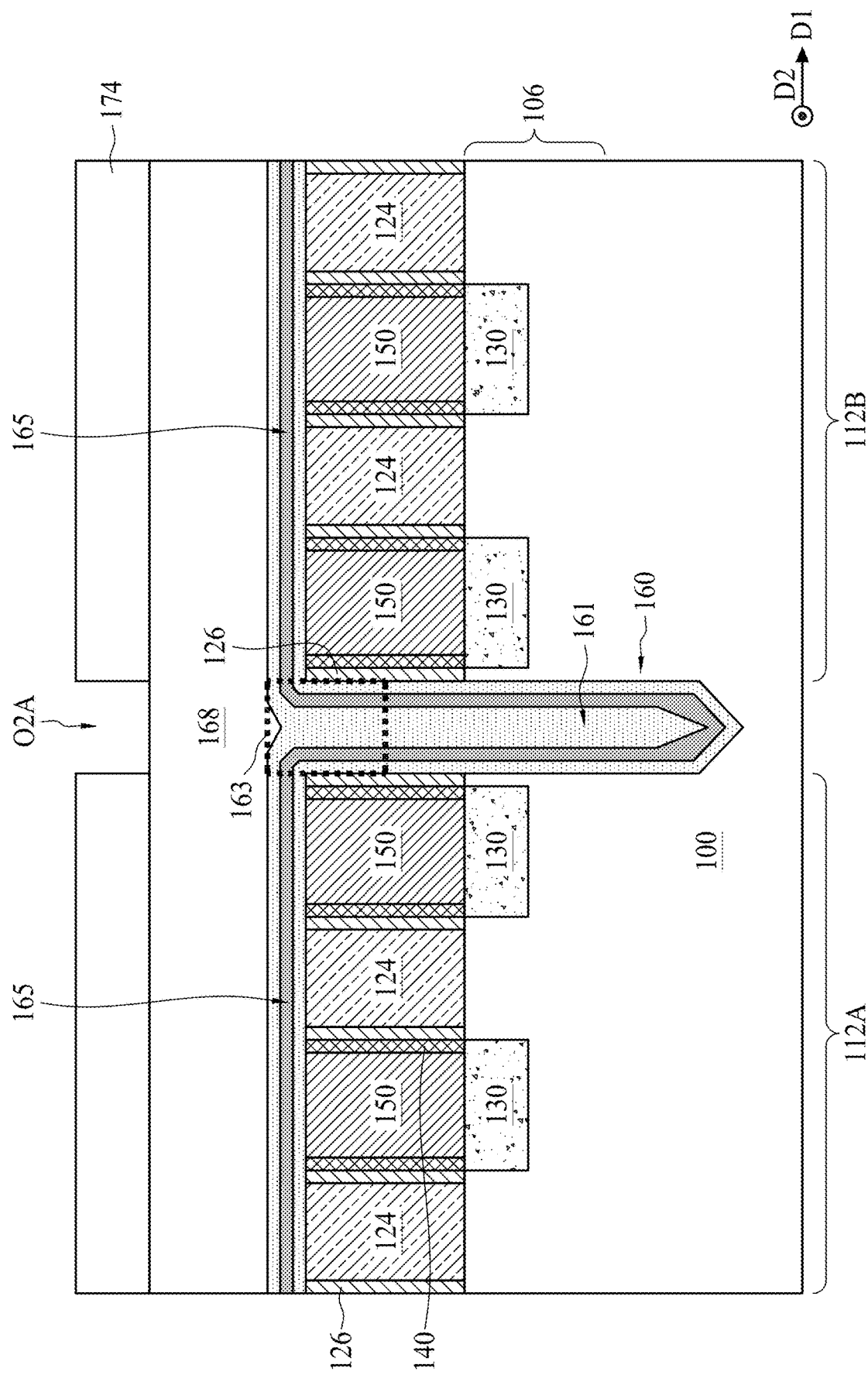

Referring to operation 223 of FIG. 2, a second patterned photoresist layer 174 is formed over the dielectric layers 162, 164, 166 and the cap layer 168, as shown in FIGS. 14A and 14B. Referring to FIG. 14A, a second photoresist layer 172 is deposited over the cap layer 168. Subsequently, the second photoresist layer 172 is exposed to a second radiation P2 via the photomask M1. After exposure, portions of the second photoresist layer 172 are developed, and the second patterned photoresist layer 174 is formed, as shown in FIG. 14B. In some embodiments, the second patterned photoresist layer 174 includes an opening O2A that exposes a top surface of the cap layer 168 and corresponds to the trench T1.

Figure 15A:
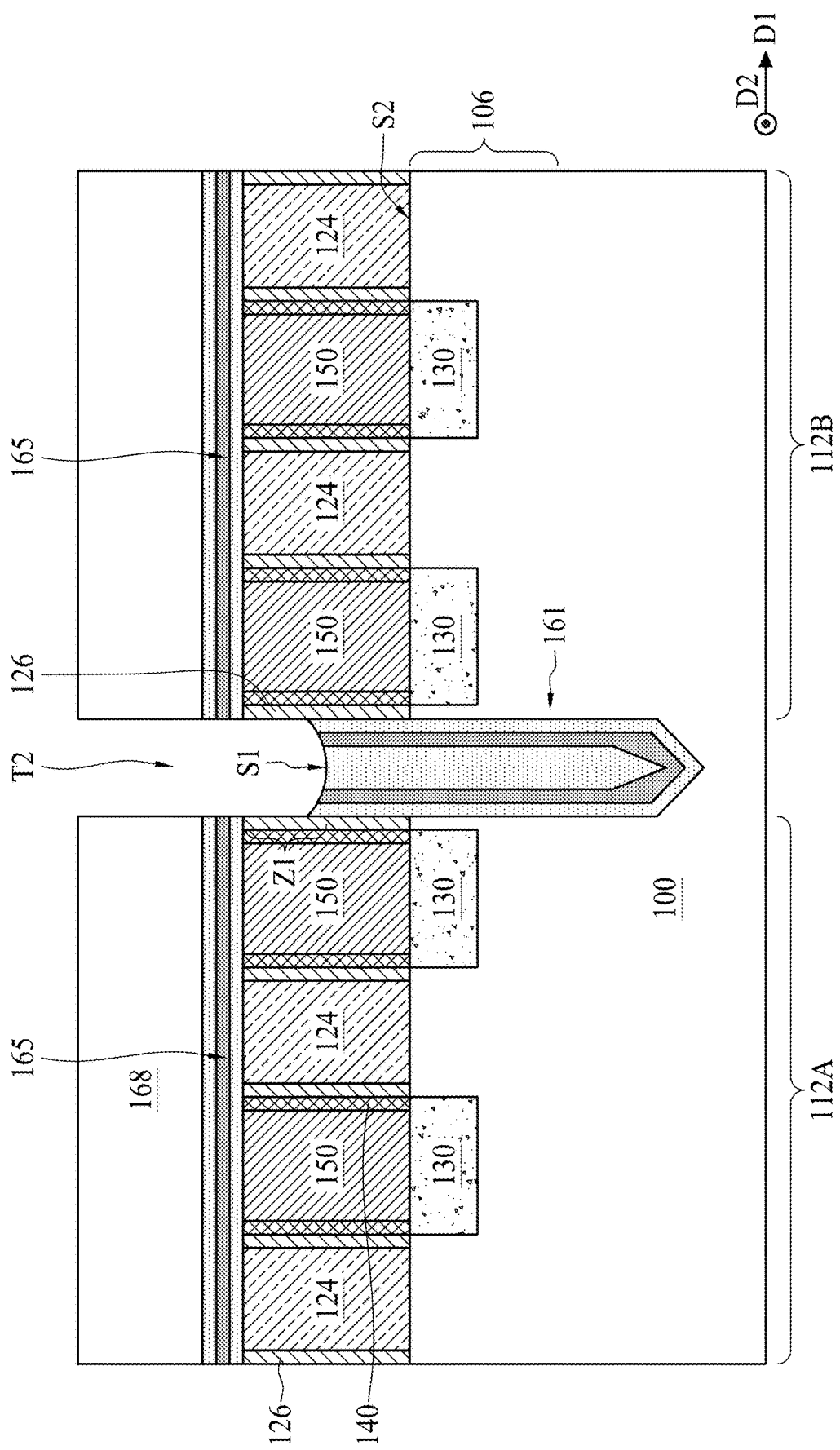

Referring to operation 225 of FIG. 2, a trench T2 is formed to penetrate the cap layer 168, as shown in FIG. 15A. In some embodiments, the formation of the trench T2 includes an etching operation such as dry etching or RIE using the second patterned photoresist layer 174 as an etching mask. In some embodiments, the etching operation vertically removes a portion of the dielectric stack 160 and a portion of the cap layer 168. The dielectric stack 160 may be etched through the opening O2A until the trench T2 with a predetermined depth Z1 is formed. In some embodiments, the upper portion 163 of the dielectric stack 160 is substantially removed during the etching operation. After the upper portion 163 is removed, the lower portion 161 is left in the trench T2 and the horizontal portions 165 are left over the dummy gates 124. The lower portion 161 may have a top surface having a concave upward shape. The lower portion 161 has a vertical profile and may be referred to as a CPODE structure 161. The CPODE structure 161 may be an isolating structure for providing electrical isolation between neighboring features. In some embodiments, multiple CPODE structures 161 are disposed over the substrate 100. In some embodiments, a top surface S1 of the CPODE structure 161 is lower than a top surface of the dummy gate 124, the gate spacer 126 or the ILD layer 150. In some embodiments, the top surface S1 of the CPODE structure 161 (the lower portion 161) is higher than the topmost surface S2 of the fin structure 106 by about 30 Å to about 60 Å and lower than a top surface of the dummy gate 124. Since the trench T1 penetrates the fin structure 106 and extends into the substrate 100, the first active region 112A and the second active region 112B may be separated by the CPODE structure 161.

Figure 15B:
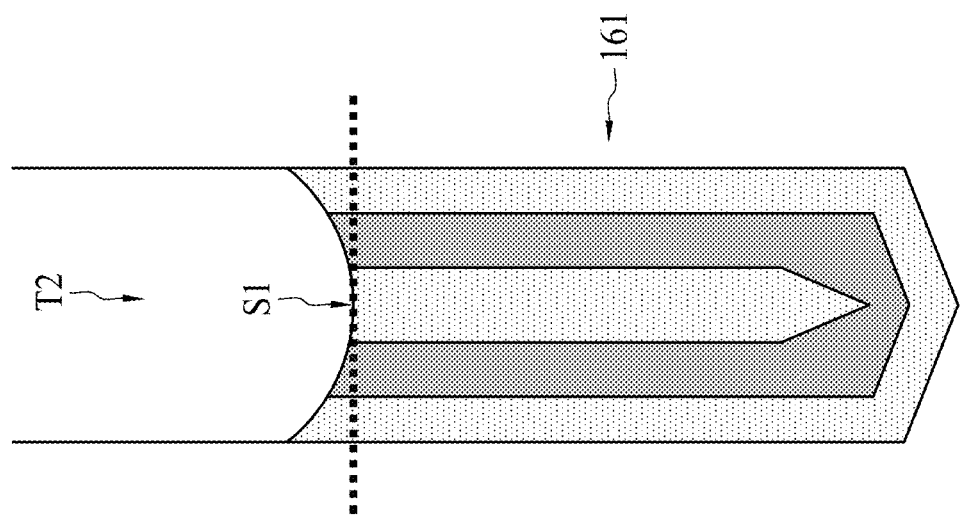
FIGS. 15B and 17B are enlarged views of FIGS. 15A and 17A, respectively, in accordance with some embodiments of the present disclosure.

FIG. 15B shows an enlarged view of the top surface S1 of the CPODE structure 161 in FIG. 15A. In some other embodiments, the top surface S1 of the CPODE structure 161 is substantially a concave surface. Due to a difference of etching rates among the first, second and third dielectric materials 162, 164 and 166, the CPODE structure 161 may have a round profile on its top portion after the etching operation.

Figure 16:
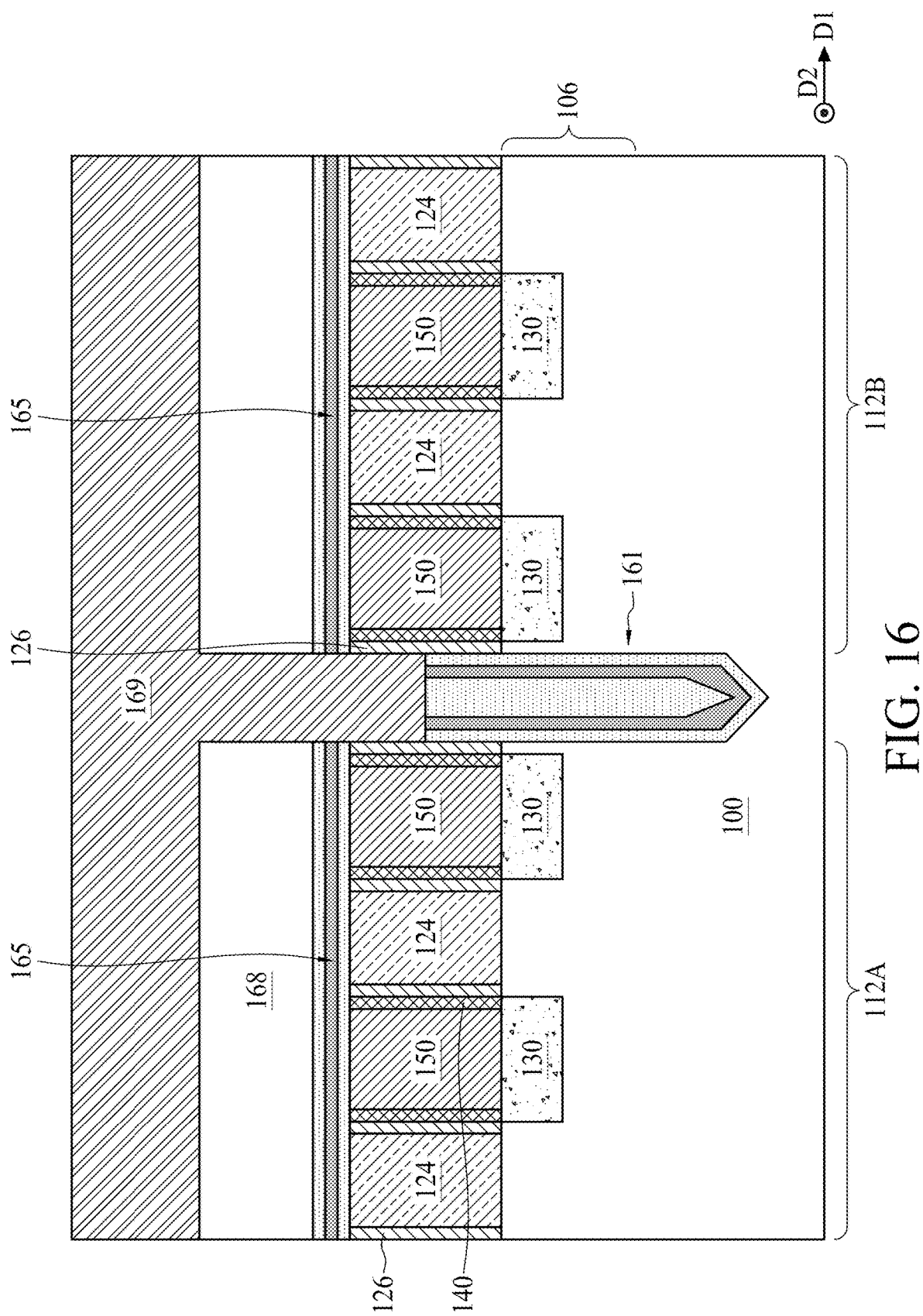

Referring to operation 227 of FIG. 2, a protective layer 169 is formed on the cap layer 168, as shown in FIG. 16. The protective layer 169 may be formed by depositing an insulating material over the cap layer 168 and within the trench T2 using spin-on coating, CVD, ALD, and/or other suitable methods. The insulating material of the protective layer 169 may include silicon nitride, silicon oxynitride, silicon carbon nitride, or other suitable materials. In some embodiments, the protective layer 169 does not include any silicon oxide. In some embodiments, the protective layer 169 in the trench T2 is directly disposed on and completely covering the lower portion 161.

Figure 17A:
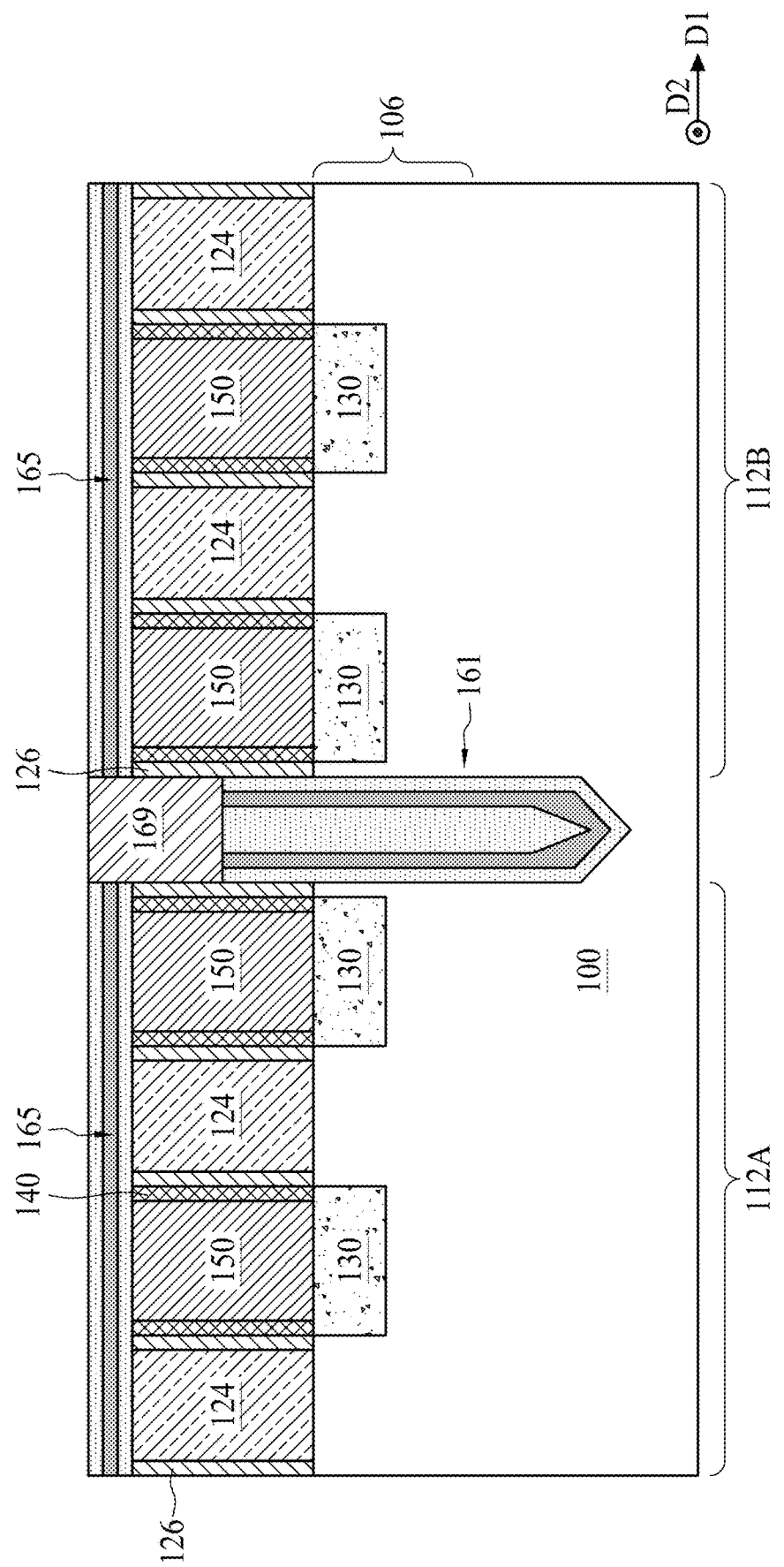
Figure 17B:
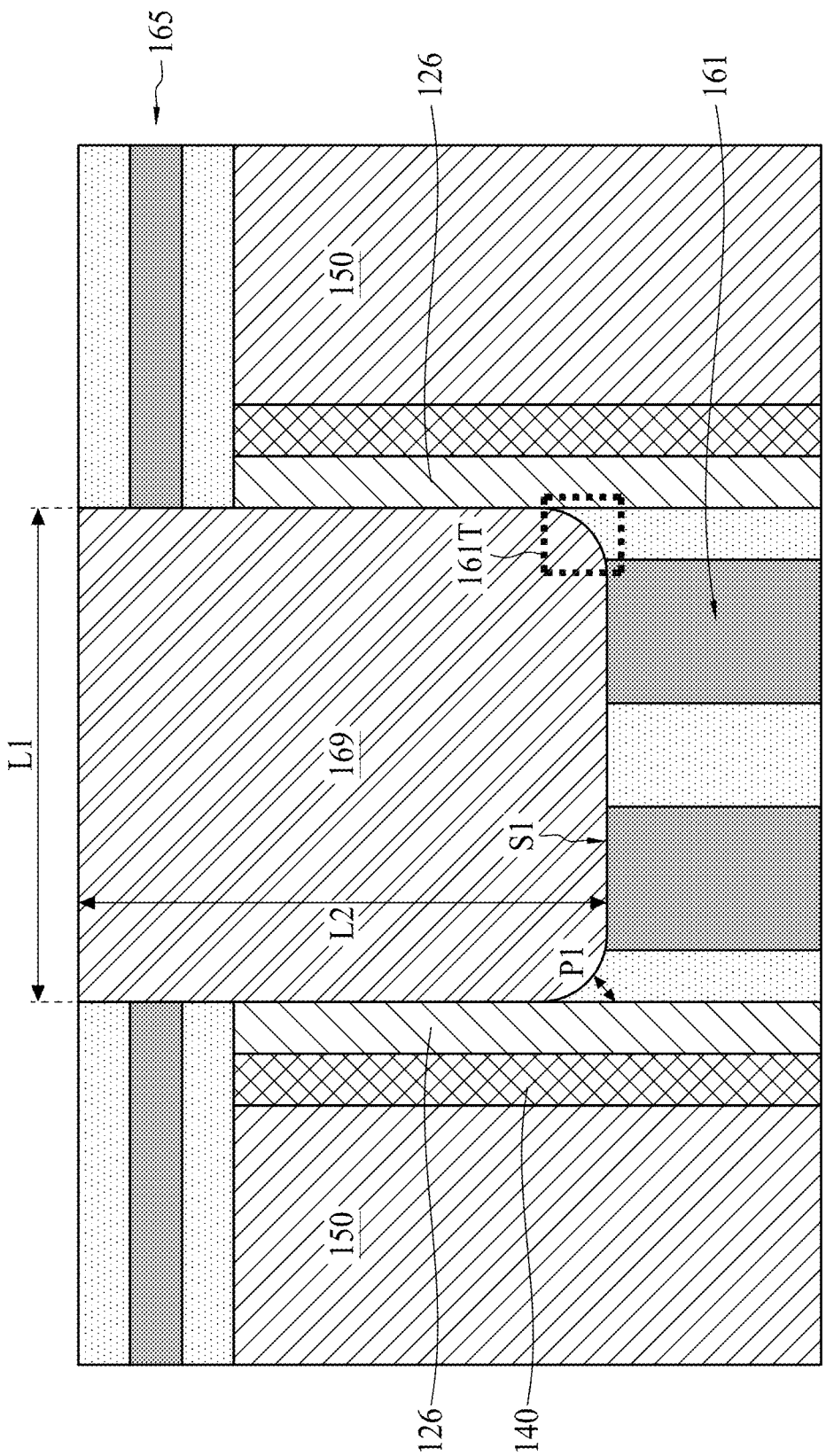

Referring to operation 229 of FIG. 2, portions of the cap layer 168 and the protective layer 169 are removed, as shown in FIGS. 17A and 17B. Referring to FIG. 17A, a removal operation such as a CMP operation or an etching operation may be used to remove excess portions of the cap layer 168 and the protective layer 169 above a topmost surface of the horizontal portion 165. After the removal operation, the protective layer 169 is formed only directly over the CPODE structure 161 and the horizontal portion 165 is exposed. In some embodiments, top surfaces of the protective layer 169 and the horizontal portions 165 are substantially coplanar.

FIG. 17B shows an enlarged view of the protective layer 169 after the removal operation in FIG. 17A. In some embodiments, a width L1 of the protective layer 169 after the removal operation is about 15 nanometers (nm) to about 40 nm, and a height L2 of the protective layer 169 after the removal operation is about 10 nm to about 100 nm. In some embodiments, the protective layer 169 has rounded corners around its bottom portions due to the concave top surface S1 of the CPODE structure 161. In some embodiments, the CPODE structure 161 has a substantially triangular portion over the top surface S1 as a protruding portion 161T, as shown in FIG. 17B. The protruding portion 161T may have a maximal thickness P1 of about 2 nm to about 10 nm.

Figure 18A:
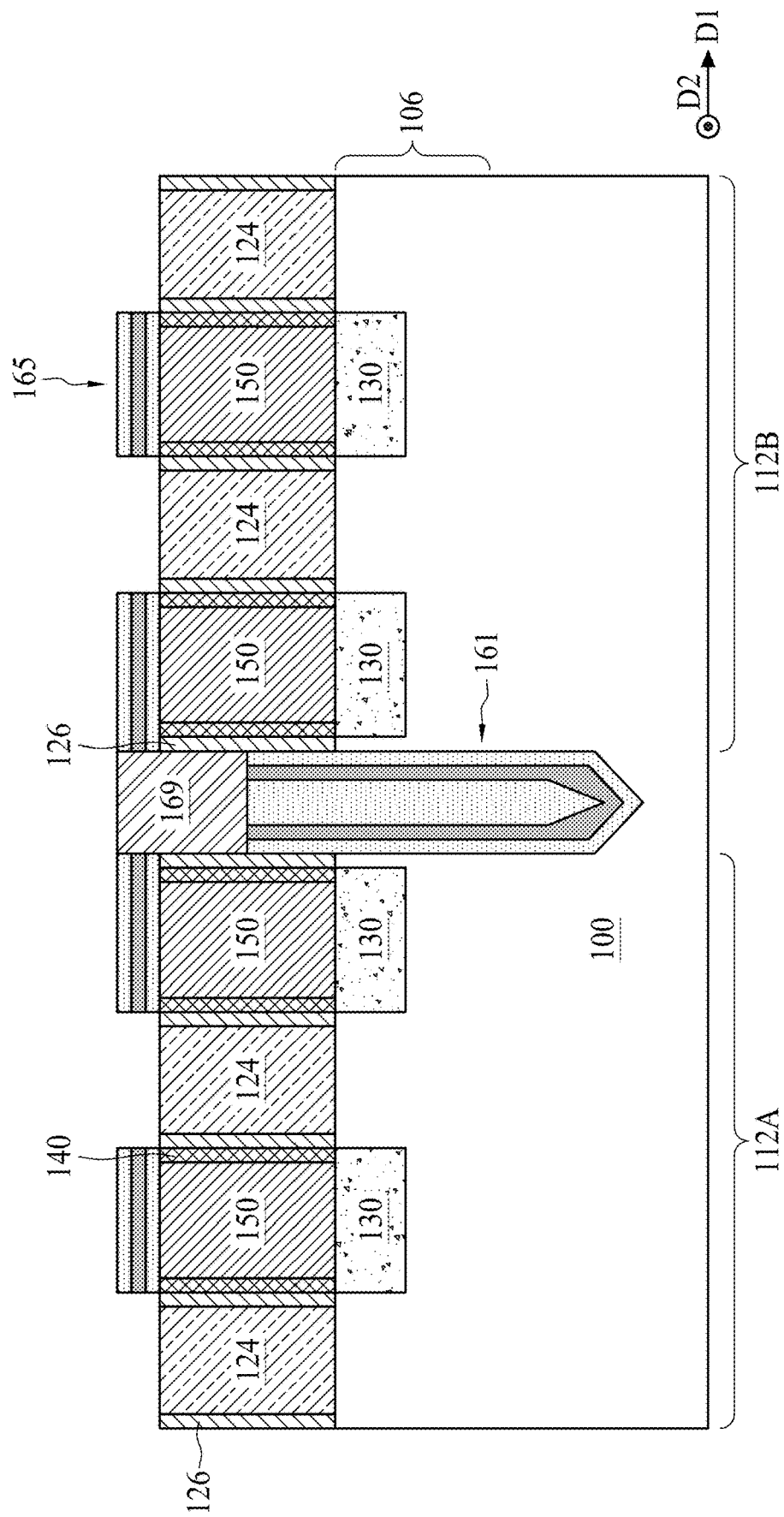
Figure 18B:
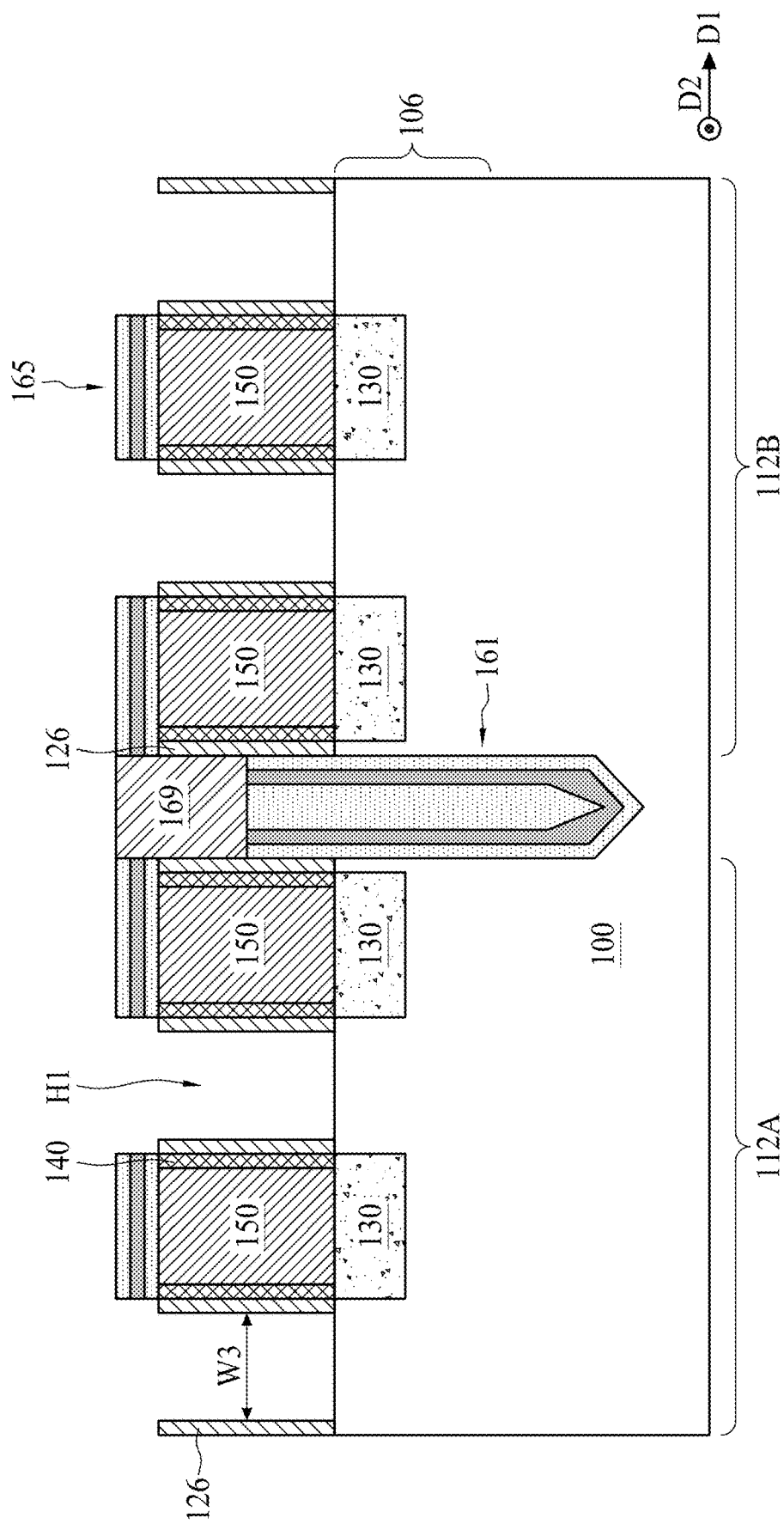

Referring to operation 231 of FIG. 2, the dummy gates 124 are removed to form multiple through holes H1, as shown in FIGS. 18A and 18B. Referring to FIG. 18A, the horizontal portions 165 are partially etched to respectively expose the underlying dummy gates 124. Referring to FIG. 18B, the exposed dummy gates 124 may be etched using an etchant selective to polysilicon. In some embodiments, the etching operation of the dummy gates 124 includes a wet etching by using a solution such as $NH_4OH$, dilute HF, and/or other suitable etchant, or a dry etching by using a gas such as fluorine-based and/or chlorine-based etchants for removing the dummy gates 124. The gate spacers 126 and the horizontal portions 165 may function as an etchant mask and are not consumed (or substantially not consumed) during the removal of the dummy gates 124. After the dummy gates 124 are removed, the through holes H1 are formed. In some embodiments, each through hole H1 is defined by the corresponding gate spacer 126. A width W3 of the through hole H1 can be adjusted based on the width W2 of the dummy gate 124. In some embodiments, the width W3 of the through hole H1 is in range of about 20 nm to about 50 nm. The through holes H1 over the fin structure 106 may extend along the first direction D1.

Figure 19:
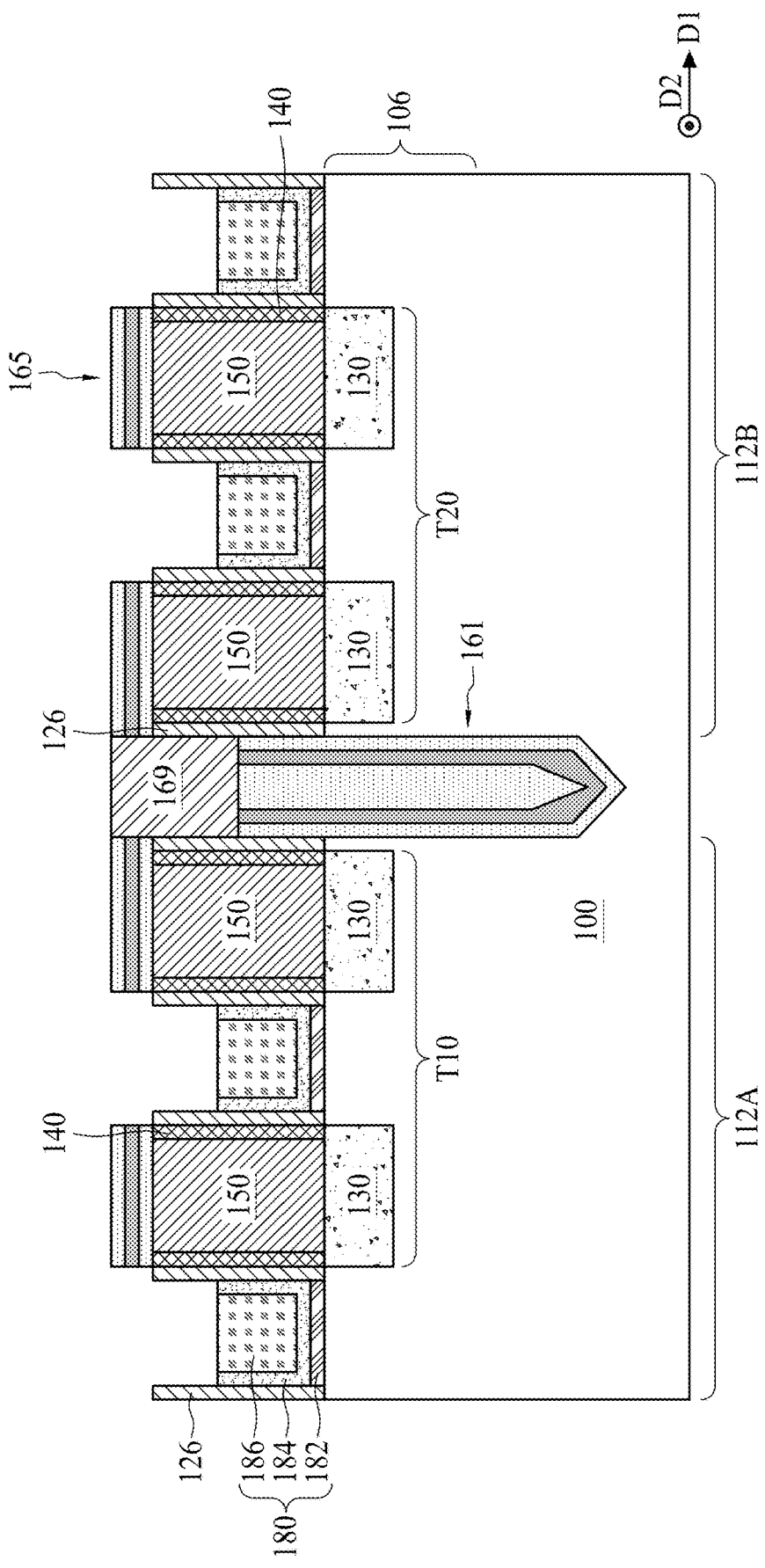

Referring to operation 233 of FIG. 2, a gate structure 180 is formed in each of the through holes H1, as shown in FIG. 19. The gate structure 180 may be a gate stack that includes multiple layers. The formation of the gate structure 180 may include multiple deposition operations and one or more etching operations. For example, various dielectric materials and conductive materials may be deposited in sequence in a blanket manner, followed by a patterning operation to form a desired profile of the gate structure 180. In some embodiments, a gate dielectric layer 182 is formed in through hole H1 on the fin structure 106 using a thermal oxidation operation or a CVD operation. The gate dielectric layer 182 may include one or more dielectric materials, such as silicon oxide, silicon nitride, silicon oxynitride, or other suitable materials. The gate dielectric layer 182 may have a planar profile.

In some embodiments, a high-k material layer 184 is formed on the gate dielectric layer 182 using CVD, PVD, ALD, and/or other suitable methods. The high-k material layer 184 may include one or more dielectric materials with high dielectric constants higher than that of silicon oxide, such as $Al_2O_3$, $HfO_2$, $ZrO_2$, HfZrO, $HfO_xN_y$, $ZrO_xN_y$, $HfSi_xO_y$, $ZrSi_xO_y$, $HfSi_xO_yN_z$, $ZrSi_xO_yN_z$, $TiO_2$, $Ta_2O_3$, $Ta_2O_5$, $La_2O_3$, $CeO_2$, $WO_3$, $Y_2O_3$, $LaAlO_3$, $Ba1-xSr_xTiO_3$, $PbTiO_3$, $BaTiO_3$ (BTO), $SrTiO_3$ (STO), $BaSrTiO_3$ (BST), $PbZrO_3$, lead-strontium-titanate (PST), lead-zinc-niobate (PZN), lead-zirconate-titanate (PZT), lead-magnesium-niobium (PMN), yttria-stabilized zirconia (YSZ), ZnO/Ag/ZnO (ZAZ), a combination thereof, or other suitable materials. The high-k material layer 184 may have a U-shape or a planar profile.

In some embodiments, a gate electrode 186 is formed on the high-k material layer 184 using an electroplating operation or a PVD operation. The gate electrode 186 may include one or more conductive materials, such as tungsten (W), copper (Cu), cobalt (Co), aluminum (Al), nickel (Ni), tantalum (Ta), titanium (Ti), molybdenum (Mo), palladium (Pd), platinum (Pt), ruthenium (Ru), iridium (Ir) silver (Ag), gold (Au), titanium nitride (TiN), tantalum nitride (TaN), a combination thereof, or other suitable materials. In one embodiment, when the high-k material layer 184 has a U-shape profile, the conductive material is deposited in a cavity surrounded by the high-k material layer 184. In another embodiment, when the high-k material layer 184 has a planar profile, the conductive material is deposited to completely cover the high-k material layer 184.

In some embodiments, the gate dielectric layer 182, the high-k material layer 184 and the gate electrode 186 are sequentially deposited in the through hole H1 to form the gate structure 180. However, details of the formation of the gate structure 180 are not limited herein. Multiple gate structures 180 may be formed on the fin structure 106 and each of the gate structures 180 may be surrounded by the corresponding gate spacers 126. In some embodiments, a height of the gate structure 180 is less than a height of the gate spacer 126. In some other embodiments, a height of the gate structure 180 is substantially equal to a height of the gate spacer 126.

Still referring to FIG. 19, a gate structure 180 and its adjacent epitaxial features 130 on one side of the CPODE structure 161 may form a transistor T10, and another gate structure 180 and its adjacent pair of epitaxial features 130 on the other side of the CPODE structure 161 may form a transistor T20. The gate structure 180 may function as a gate terminal of the transistor T10 or T20, and the pair of epitaxial features 130 may function as source/drain terminals of the transistor T10 or T20. The transistors T10 and T20 may be field-effect transistor (FET) devices. In some embodiments, the transistors T10 and T20 are planar-type FET devices, fin-type FET devices, gate-all-around (GAA) FET devices, nanosheet FET devices or nanowire FET devices, but the configuration of the transistors T10 and T20 is not limited thereto. In some embodiments, the transistors T10 and T20 are N-type MOSFET (NMOS) when the epitaxial features 130 include N-type dopants. In some other embodiments, the transistors T10 and T20 are P-type MOSFET (PMOS) when the epitaxial features 130 include P-type dopants. Still in some embodiments, the transistor T10 is an NMOS transistor while the transistor T20 is a PMOS transistor, or the transistor T10 is a PMOS transistor while the transistor T20 is an NMOS transistor.

Comparing FIGS. 10 and 19, each of the dummy gates 124 is replaced by a corresponding gate structure 180. The conversion of a dummy gate (such as the dummy gate 124) into a functional gate (such as the gate structure 180) uses a technique referred to as "replacement polysilicon gate (RPG)". The dummy gate 124 does not function as a gate terminal of a transistor, but is used as a sacrificial structure for forming the transistor. During the formation of the transistors T10 and T20, the dummy gates 124 are replaced by the functional gate structures 180. After the formation of the gate structures 180, the transistors T10 and T20 are completed. Thus, the RPG technique may also be called a "gate last" technique.

Figure 20:
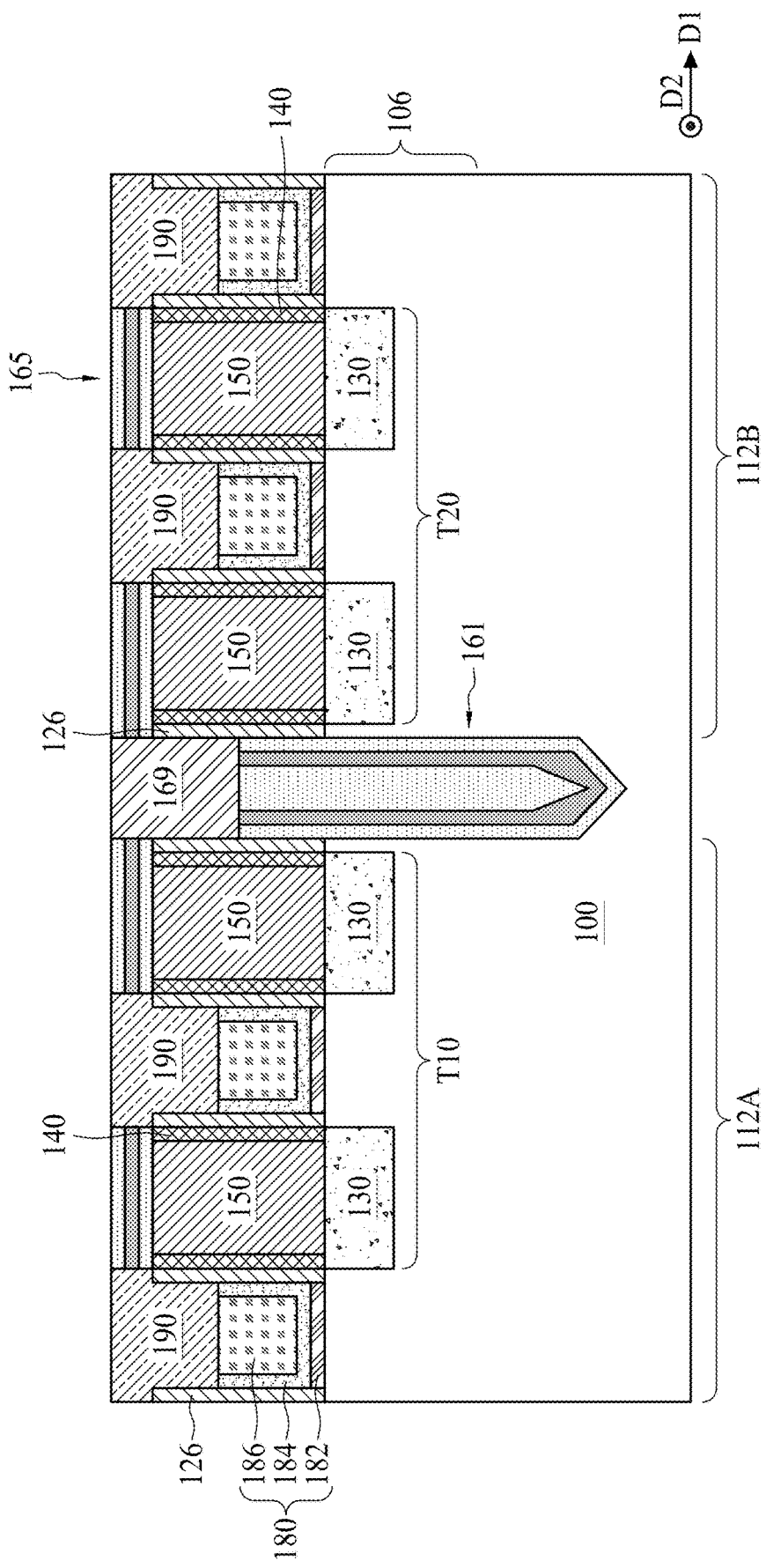

Referring to operation 235 of FIG. 2, a hard mask 190 is formed on the gate structure 180 and the gate spacer 126, as shown in FIG. 20. The formation of the hard mask 190 includes depositing silicon nitride to completely cover the gate structure 180. A CMP operation may be used to remove the excess material of the hard mask 190 over the horizontal portions 165. As such, a top surface of the hard mask 190 is substantially coplanar with top surfaces of the horizontal portions 165 or the protective layer 169. The operation steps for forming the features discussed above with reference to FIG. 3 to FIG. 20 may be collectively referred to as the FEOL stage. In the following, descriptions of operation steps in the MEOL stage and BEOL stage are provided.

In the MEOL stage, a conductive structure such as a conductive contact or a conductive via is formed over the substrate. The conductive structure may be used to electrically connect a gate terminal or a source/drain terminal of a transistor to one or more conductive layers formed in the BEOL stage.

Figure 21:
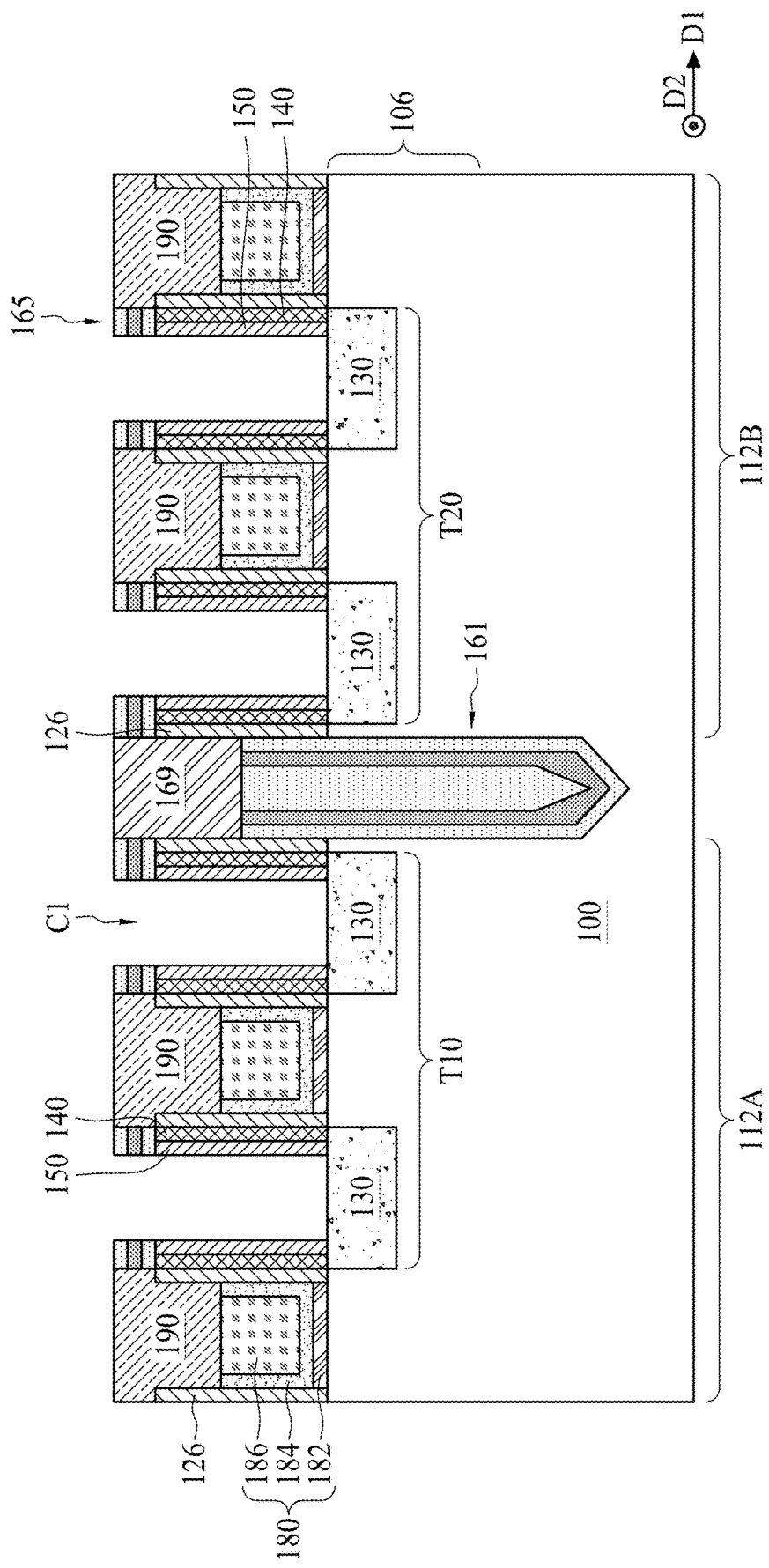
Figure 22:
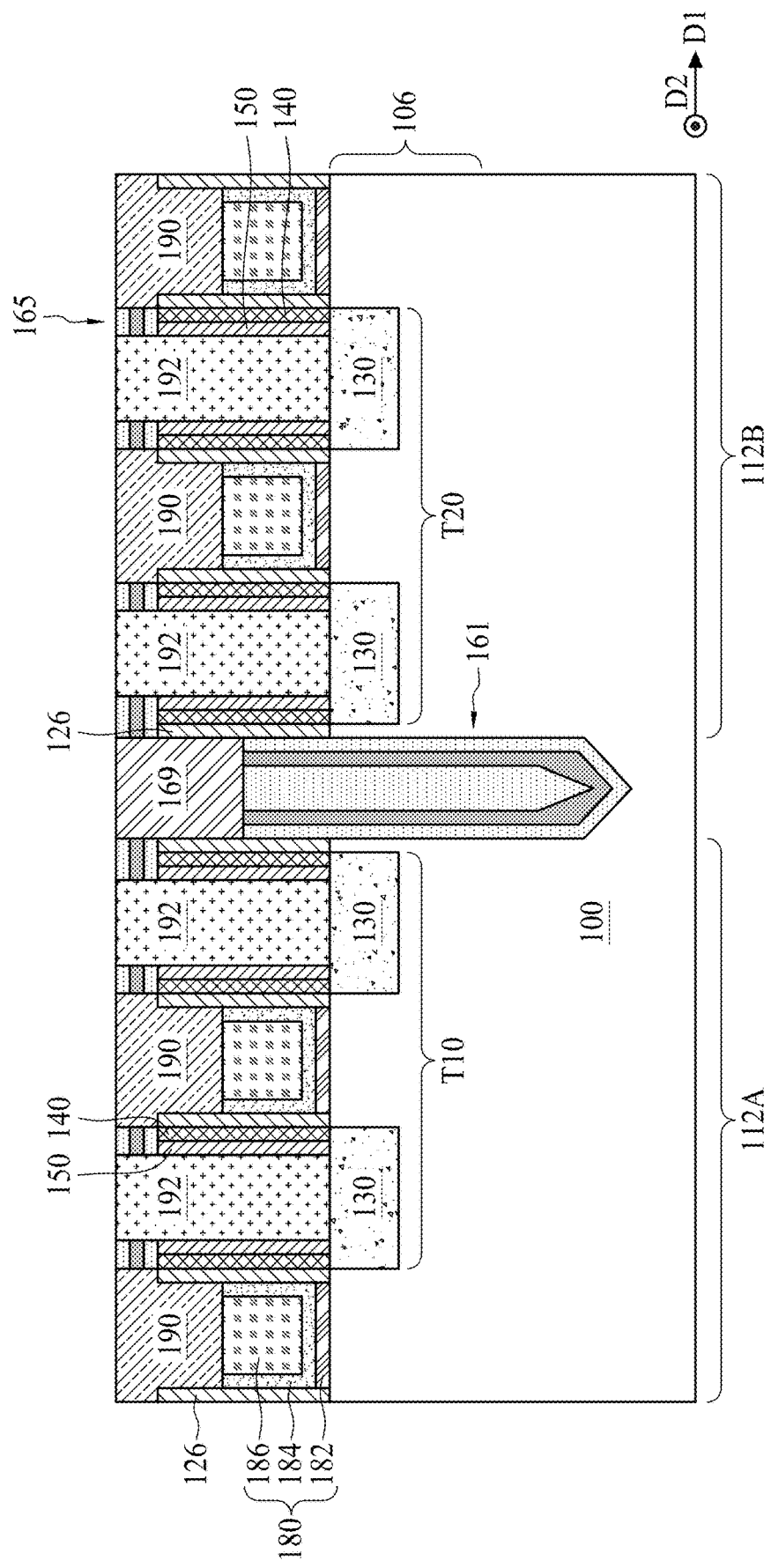

Referring to operation 237 of FIG. 2, a conductive via 192 is formed on the epitaxial feature 130, as shown in FIGS. 21 and 22. Referring to FIG. 21, a contact hole C1 is formed to expose the epitaxial feature 130. In some embodiments, the formation of the contact hole C1 does not include a lithographic operation. The hard mask 190 and the protective layer 169 may be directly used as an etching mask for protecting the underlying layers. An etching operation such as RIE may be used to vertically etch the horizontal portion 165, the ILD layer 150 and the etch stop layer 140 until the epitaxial feature 130 is exposed. Multiple contact holes C1 may be formed and each contact hole C1 exposes the underlying epitaxial feature 130.

In some embodiments, the etchant used in the formation of the contact holes C1 may be reactive to the horizontal portions 165 since the horizontal portions 165 are to be etched as well. Therefore, if the CPODE structure 161, which has the same composition as the horizontal portions 165, is exposed during the formation of the contact holes C1, the CPODE structure 161 may be damaged, thereby degrading its function of preventing a leakage current between the two transistors T10 and T20. In some embodiments, the protective layer 169 isolates the CPODE structure 161 from the etchant used in the formation of the contact holes C1 and prevents the CPODE structure 161 from being consumed or damaged by the etchant. As a result, the CPODE structure 161 substantially remains intact after the contact holes C1 are formed. The transistors T10 and T20 can be separated by the CPODE structure 161. Since the CPODE structure 161 remains intact, after the contact vias 192 are subsequently formed in adjacent contact holes C1 on two sides of the CPODE structure 161, electrical bridging between the two transistors T10 and T20 may be reduced or prevented. When the transistors T10 and T20 are different types of transistors, a difference between threshold voltages ($V_{th}$) of the NMOS and PMOS transistors is a critical issue in the operation of low voltage circuits. Since the CPODE structure 161 includes multiple dielectric materials arranged in a stacked manner, the P/N threshold voltages can be significantly balanced. In some embodiments, balancing the P/N threshold voltages reduces a lowest required supply voltage by about 0.15 volts (V) to about 0.3 V.

Referring to FIG. 22, a conductive material is deposited into the contact hole C1 using electroplating, PVD, CVD, and/or other suitable methods. The conductive material may include one or more conductive materials, such as tungsten (W), copper (Cu), cobalt (Co), aluminum (Al), nickel (Ni), tantalum (Ta), titanium (Ti), molybdenum (Mo), palladium (Pd), platinum (Pt), ruthenium (Ru), iridium (Ir) silver (Ag), gold (Au), or other suitable materials. A CMP operation may be used to remove the conductive material over the hard mask 190. As such, the conductive via 192 is formed in the contact hole C1 and on the epitaxial feature 130. The conductive via 192 may extend through the ILD layer 150. In some embodiments, the conductive via 192 is electrically coupled to the underlying epitaxial feature 130. The conductive via 192 may be referred to herein as a metal-to-drain (MD) feature that connects a doped region (i.e., the epitaxial feature 130) in the fin structure 106 to a conductive layer overlying the doped region.

Figure 23:
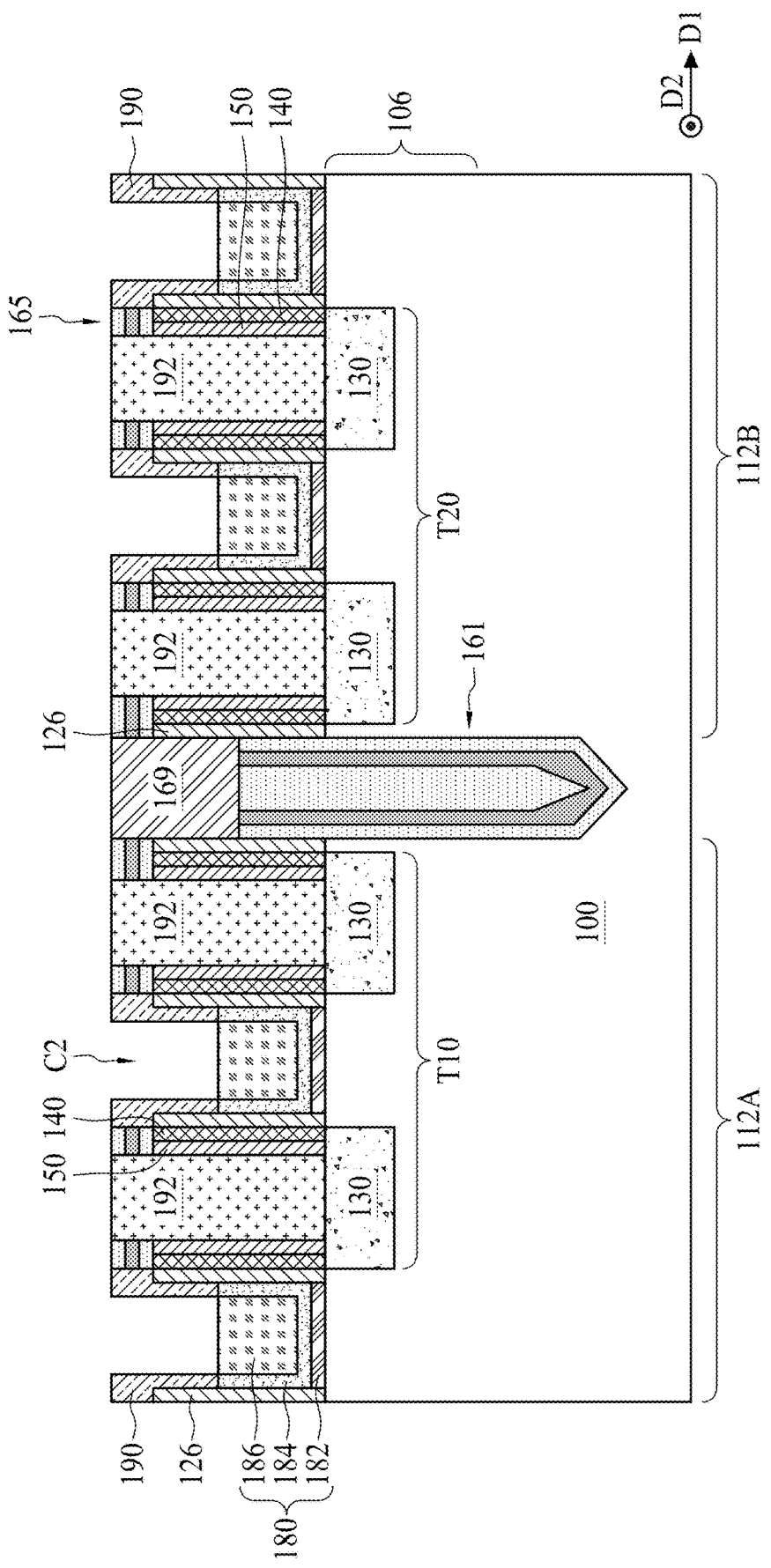
Figure 24:
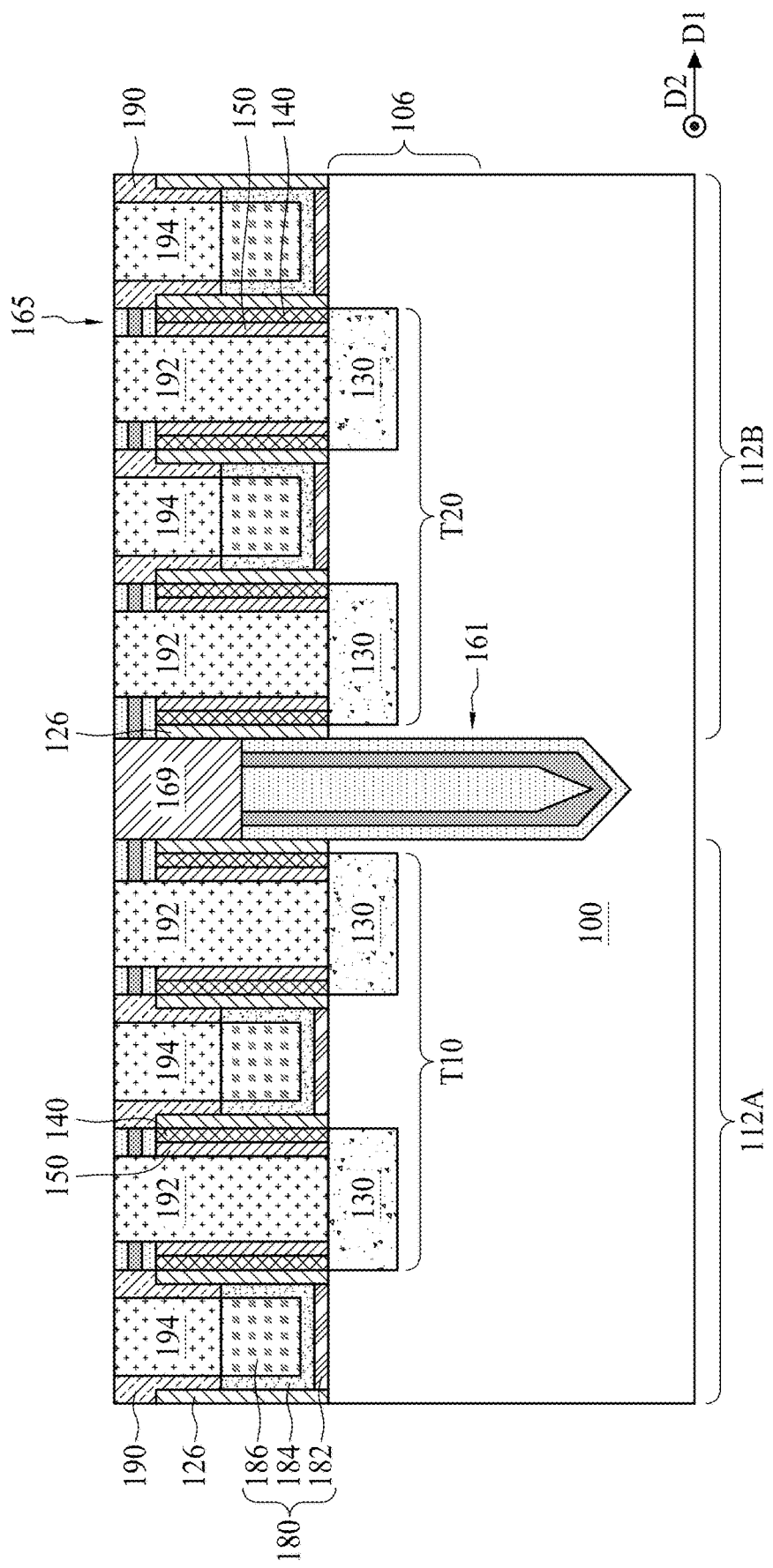

Referring to operation 239 of FIG. 2, a conductive via 194 is formed on the gate structure 180, as shown in FIGS. 23 and 24. Referring to FIG. 23, a contact hole C2 is formed to penetrate the hard mask 190. The formation of the contact hole C2 includes at least a lithographic operation and an etching operation such as dry etching or RIE. In some embodiments, the etching operation removes a portion of the hard mask 190 to expose the gate electrode 186. Multiple contact holes C2 may be formed and each contact hole C2 exposes the underlying gate electrode 186.

Referring to FIG. 24, a conductive material is deposited into the contact hole C2 using electroplating, PVD, CVD, and/or other suitable methods. The conductive material may be the same material as that of the conductive via 192. A CMP operation may be used to remove the conductive material over the hard mask 190. As such, the conductive via 194 is formed in the contact hole C2 and on the gate electrode 186. The conductive via 194 may extend through the hard mask 190. In some embodiments, the conductive via 194 is electrically coupled to the underlying gate electrode 186. The conductive via 194 may be referred to herein as a via-to-gate (VG) feature that connects a gate terminal (i.e., the gate electrode 186) of the gate structure 180 to a conductive layer overlying the gate terminal.

Figure 25:
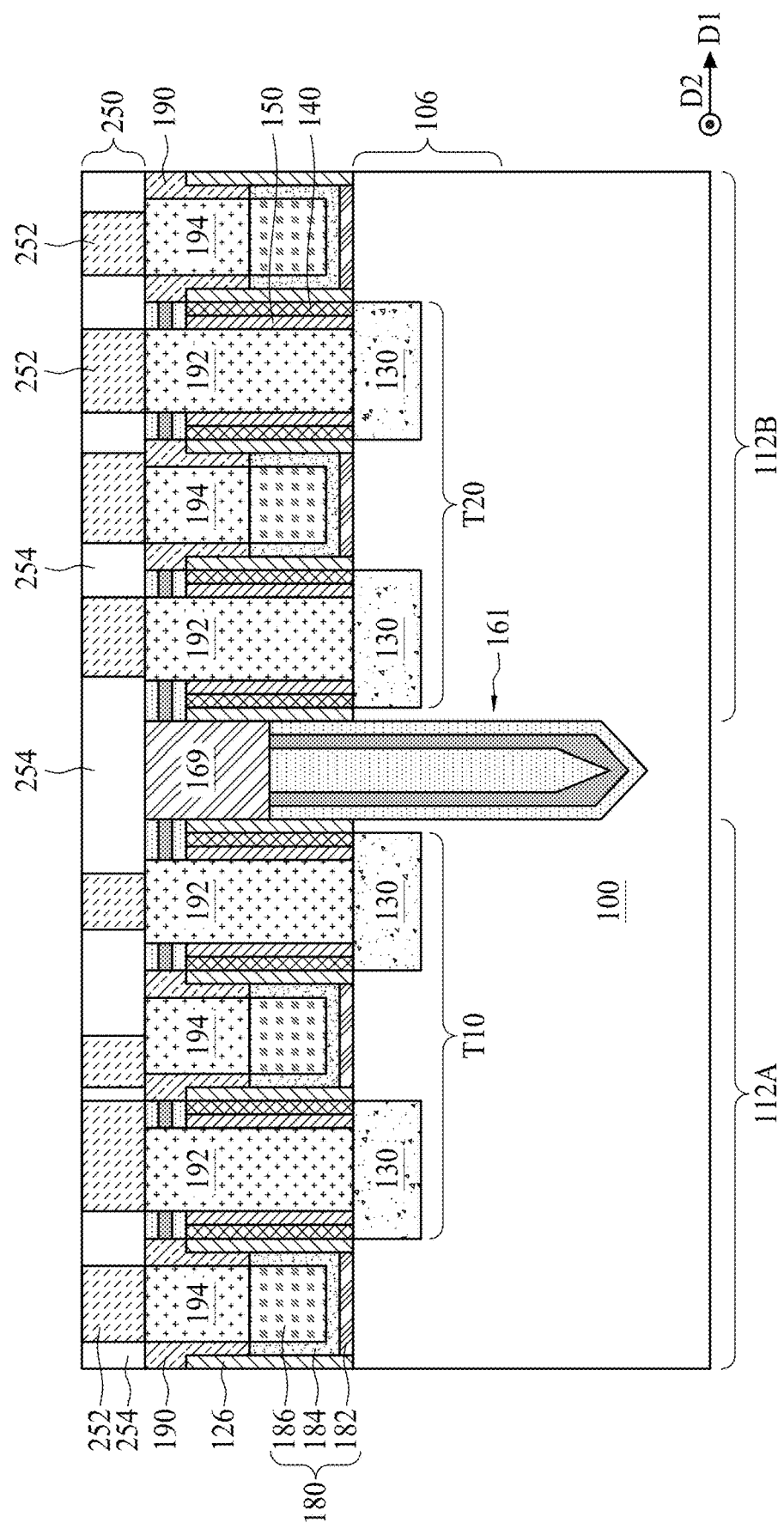

In the BEOL stage, multiple dielectric and conductive features are formed. Referring to operation 241 of FIG. 2, an interconnect layer 250 is formed over the conductive vias 192 and 194, as shown in FIG. 25. The interconnect layer 250 includes a metal line layer 252 embedded in an ILD layer 254. The formation of the interconnect layer 250 includes one or more deposition, lithographic and etching operations. The metal line layer 252 may include one or more conductive materials, such as tungsten (W), copper (Cu), cobalt (Co), aluminum (Al), nickel (Ni), tantalum (Ta) or titanium (Ti). The ILD layer 254 may include a low dielectric constant (k value less than about 3.0) or an extreme low dielectric constant (k value less than about 2.5) material. For example, the ILD layer 254 may be made of silicon oxide, borophosphosilicate glass (BPSG), TEOS, spin-on glass (SOG), undoped silicate glass (USG), fluorinated silicate glass (FSG), high-density plasma (HDP) oxide, or plasma-enhanced TEOS (PETEOS). A CMP operation may be used to planarize a top surface of the interconnect layer 250. In some embodiments, the metal line layer 252 is disposed over and electrically coupled to the conductive vias 192 and 194. The metal line layer 252 may be referred to herein as an $M_0$ metal line layer that electrically connects various features over the substrate 100, such as the transistor T10 and the transistor T20, to overlying features.

Figure 26:
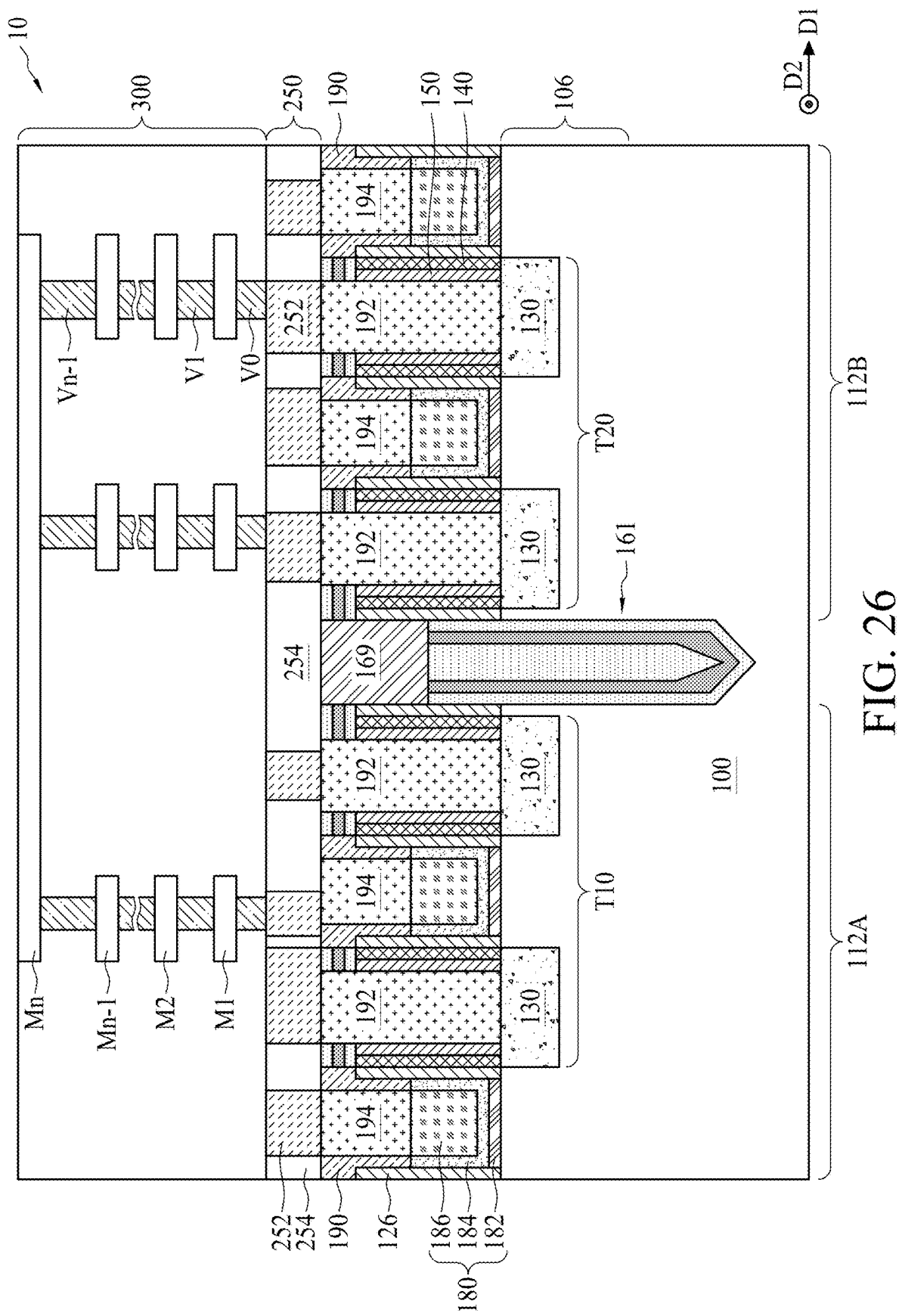

Referring to operation 243 of FIG. 2, a metallization layer 300 is formed over the interconnect layer 250, as shown in FIG. 26. The formation of the metallization layer 300 may include a series of deposition, lithographic, etching and planarization operations. The metallization layer 300 may be formed of a stack of interconnected metal line layers (wires) and metal via layers. For example, the metal line layers $M_1, \ldots M_{n-1}, M_n$ (the integer n denotes the layer index) are formed over one another and include horizontally extending metal lines. The metal via layers $V_0, \ldots V_{n-1}$ (the integer n denotes the layer index) are formed over one another and include vertically extending metal lines. A metal via layer $V_n$ is interposed between an underlying metal line layer $M_n$ and an overlying metal line layer $M_{n+1}$ and electrically connects the metal line layer $M_n$ and $M_{n+1}$. People having ordinary skill in the art can understand that the numbers provided for the metal line layers $M_n$ and metal via layers $V_n$ described herein are not limiting. The numbers and configurations of the metallization layer 300 can be adjusted on demand according to the design requirement. The metallization layer 300 may be referred to as a stacked routing structure formed in the BEOL stage. As such, the semiconductor structure 10 is formed.

One aspect of the present disclosure provides a method of manufacturing a semiconductor structure. The method includes providing a substrate; forming a fin structure on the substrate; forming a first dummy gate on the fin structure; forming a trench to penetrate the first dummy gate and the fin structure; forming a dielectric stack in the trench; removing a top portion of the dielectric stack in the trench to leave a lower portion of the dielectric stack in the trench; and forming a protective layer in the trench and directly on the lower portion of the dielectric stack.

One aspect of the present disclosure provides another method of manufacturing a semiconductor structure. The method includes forming a fin structure on a substrate; forming a first dummy gate, a second dummy gate and a third dummy gate over the fin structure, wherein the second dummy gate is between the first dummy gate and the third dummy gate; forming a trench to penetrate the second dummy gate and the fin structure; forming a dielectric stack in the trench and over the first dummy gate and the third dummy gate; forming a protective layer in the trench over the dielectric stack.

Another aspect of the present disclosure provides a semiconductor structure. The semiconductor structure includes a substrate; a fin structure on the substrate; a first transistor on the fin structure, the first transistor including a first gate structure and a first source/drain structure; a second transistor on the fin structure and adjacent to the first transistor, the second transistor including a second gate structure and a second source/drain structure; a first conductive via disposed over the first source/drain structure; a second conductive via disposed over the second source/drain structure; an insulating structure penetrating the fin structure; and a protective layer directly over the insulating structure, wherein the insulating structure and the protective layer separate the first conductive via and the second conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
   providing a substrate;
   forming a fin structure on the substrate;
   forming a first dummy gate on the fin structure;
   forming a trench to penetrate the first dummy gate and the fin structure;
   forming a dielectric stack in the trench;
   removing a top portion of the dielectric stack in the trench to leave a lower portion of the dielectric stack in the trench; and
   forming a protective layer in the trench and directly on the lower portion of the dielectric stack, wherein the forming of the protective layer includes:
      depositing a cap layer over the dielectric stack;
      patterning the cap layer and the dielectric stack to form an opening aligned with the trench; and
      filling the opening with the protective layer.

2. The method of claim 1, further comprising:
   forming a second dummy gate and a third dummy gate on opposite sides of the first dummy gate after the forming of the fin structure; and
   forming a first epitaxial feature on opposite sides of the second dummy gate and a second epitaxial feature on opposite sides of the third dummy gate.

3. The method of claim 2, wherein after the removing of the top portion of the dielectric stack in the trench, a top surface of the lower portion is lower than a top surface of the second dummy gate or the third dummy gate.

4. The method of claim 3, wherein the forming of the trench includes:
   coating a photoresist layer over the second dummy gate and the third dummy gate;
   exposing the photoresist layer to radiation via a photomask;
   developing the photoresist layer to form a patterned photoresist layer including a first opening over the first dummy gate; and
   etching the first dummy gate, the fin structure and the substrate by using the patterned photoresist layer as an etching mask.

5. The method of claim 2, further comprising:
   forming an interlayer dielectric (ILD) layer on the first epitaxial feature and the second epitaxial feature; and
   forming a plurality of contact holes by etching the ILD layer until the first epitaxial feature and the second epitaxial feature are exposed, wherein the protective layer is used as an etching mask during the forming of the plurality of contact holes.

6. The method of claim 1, wherein the forming of the dielectric stack includes:
   conformally depositing a first dielectric layer containing silicon oxide into the trench;
   conformally depositing a second dielectric layer containing silicon nitride over the first dielectric layer; and
   depositing a third dielectric layer containing silicon oxide over the second dielectric layer.

7. The method of claim 1, wherein the protective layer includes silicon nitride, silicon oxynitride or silicon carbon nitride.

8. The method of claim 1, wherein the dielectric stack in the trench remains intact after the forming of the plurality of contact holes.

9. The method of claim 1, wherein the protective layer is made of silicon nitride or silicon carbon nitride.

10. A method of manufacturing a semiconductor structure, comprising:
    forming a fin structure on a substrate;
    forming a first dummy gate, a second dummy gate and a third dummy gate over the fin structure, wherein the second dummy gate is between the first dummy gate and the third dummy gate;
    forming a first epitaxial feature and a second epitaxial feature on the fin structure, wherein the first epitaxial feature is between the first dummy gate and the second dummy gate, and the second epitaxial feature is between the second dummy gate and the third dummy gate;
    forming an interlayer dielectric (ILD) layer on the first epitaxial feature and the second epitaxial feature;
    forming a trench to penetrate the second dummy gate and the fin structure;
    forming a dielectric stack in the trench and over the first dummy gate and the third dummy gate;
    depositing a cap layer over the dielectric stack;
    patterning the cap layer and the dielectric stack to form an opening aligned with the trench; and
    filling the opening with a protective layer.

11. The method of claim 10, wherein after the forming of the protective layer, further comprising:
    replacing the first dummy gate with a first functional gate and replacing the third dummy gate with a second functional gate, wherein each of the first functional gate and the second functional gate includes a gate dielectric layer, a high-k material layer over the gate dielectric layer and a gate electrode over the high-k material layer.

12. The method of claim 11, further comprising:
    depositing a hard mask over the first and second functional gates;
    etching the ILD layer by using the hard mask and the protective layer as an etching mask until the first epitaxial feature and the second epitaxial feature are exposed; and
    depositing a conductive material on the first epitaxial feature and the second epitaxial feature to form a first conductive via and a second conductive via, respectively.

13. The method of claim 12, wherein the protective layer prevents a lower portion of the dielectric stack in the trench from being consumed during the etching of the ILD layer.

14. The method of claim 12, wherein the protective layer prevents a lower portion of the dielectric stack in the trench from exposure to an etchant used during the etching of the ILD layer.

15. The method of claim 10, prior to the forming of the protective layer, further comprising removing a top portion of the dielectric stack in the trench to leave a lower portion of the dielectric stack in the trench, wherein after the removing of the top portion of the dielectric stack in the trench, the lower portion of the dielectric stack includes a top surface having a concave upward shape.

16. A method of manufacturing a semiconductor structure, comprising:
    forming a fin structure on a substrate;
    forming a first transistor on the fin structure, wherein the first transistor includes a first gate structure and a first source/drain structure;
    forming a second transistor on the fin structure and adjacent to the first transistor, wherein the second transistor includes a second gate structure and a second source/drain structure;

forming a first conductive via over the first source/drain structure and a second conductive via over the second source/drain structure;

recessing a portion of the fin structure to form a trench, wherein the trench is between the first transistor and the second transistor;

filling the trench with a dielectric stack;

depositing a cap layer over the dielectric stack;

patterning the cap layer and the dielectric stack to form an opening aligned with the trench; and filling the opening with a protective layer.

17. The method of claim 16, wherein the dielectric stack and the protective layer separate the first conductive via and the second conductive via.

18. The method of claim 16, wherein the trench extends into the substrate.

19. The method of claim 16, wherein a top surface of the dielectric stack is higher than a top surface of the fin structure.

20. The method of claim 16, wherein the dielectric stack includes a first oxide layer, a nitride layer over the first oxide layer and a second oxide layer over the nitride layer.

* * * * *